(12) United States Patent
Kawakami et al.

(10) Patent No.: US 8,299,614 B2
(45) Date of Patent: Oct. 30, 2012

(54) INTERCONNECTION STRUCTURE, A THIN FILM TRANSISTOR SUBSTRATE, AND A MANUFACTURING METHOD THEREOF, AS WELL AS A DISPLAY DEVICE

(75) Inventors: Nobuyuki Kawakami, Kobe (JP); Mototaka Ochi, Kobe (JP); Aya Miki, Kobe (JP); Shinya Morita, Kobe (JP); Yoshihiro Yokota, Kobe (JP); Shinya Fukuma, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 42 days.

(21) Appl. No.: 12/936,572

(22) PCT Filed: Apr. 17, 2009

(86) PCT No.: PCT/JP2009/057791
§ 371 (c)(1),
(2), (4) Date: Oct. 6, 2010

(87) PCT Pub. No.: WO2009/128542
PCT Pub. Date: Oct. 22, 2009

(65) Prior Publication Data
US 2011/0024761 A1 Feb. 3, 2011

(30) Foreign Application Priority Data

Apr. 18, 2008 (JP) .................. 2008-109618
Sep. 30, 2008 (JP) .................. 2008-253840

(51) Int. Cl.
*H01L 23/48* (2006.01)

(52) U.S. Cl. ............... 257/751; 257/765; 257/E33.063; 438/633

(58) Field of Classification Search ............ 257/740, 257/750, 751, 765, 767, 771, E33.063, E33.066; 438/618, 652, 653, 659, 660, 688
See application file for complete search history.

(56) References Cited

U.S. PATENT DOCUMENTS 5,514,909 A 5/1996 Yamamoto et al.
6,033,542 A 3/2000 Yamamoto et al.
(Continued)

FOREIGN PATENT DOCUMENTS
JP 61 285762 12/1986
(Continued)

OTHER PUBLICATIONS
U.S. Appl. No. 13/122,937, filed Apr. 6, 2011, Nanbu, et al.
(Continued)

*Primary Examiner* — Tucker Wright
(74) *Attorney, Agent, or Firm* — Oblon, Spivak, McClelland, Maier & Neustadt, L.L.P.

(57) ABSTRACT

An interconnection structure, containing a substrate and, in the following order from a side of the substrate: (I) a semiconductor layer; (II) a multilayer structure including (II-a) a first layer containing at least one type of an element selected from the group consisting of nitrogen, carbon and fluorine and (II-b) an Al—Si diffusion layer containing Al and Si; and (III) an Al film of pure Al or an Al alloy, wherein the at least one of element selected from the group consisting of nitrogen, carbon, and fluorine in the first layer is bonded with Si contained in the semiconductor layer.

20 Claims, 12 Drawing Sheets

U.S. PATENT DOCUMENTS

| | | |
|---|---|---|
| 6,096,438 A | 8/2000 | Takagi et al. |
| 6,218,206 B1 | 4/2001 | Inoue et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 7,553,754 B2 | 6/2009 | Gotoh et al. |
| 7,622,809 B2 | 11/2009 | Gotoh et al. |
| 7,683,370 B2 | 3/2010 | Kugimiya et al. |
| 7,781,767 B2 | 8/2010 | Kawakami et al. |
| 2003/0047812 A1 | 3/2003 | Hagihara et al. |
| 2006/0091792 A1 | 5/2006 | Kugimiya et al. |
| 2006/0180250 A1 | 8/2006 | Kugimiya et al. |
| 2006/0275618 A1 | 12/2006 | Kugimiya et al. |
| 2007/0040172 A1* | 2/2007 | Kawakami et al. ............ 257/59 |
| 2007/0295963 A1 | 12/2007 | Yano et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2008/0315203 A1 | 12/2008 | Hino et al. |
| 2009/0001373 A1 | 1/2009 | Ochi et al. |
| 2009/0004490 A1 | 1/2009 | Gotou et al. |
| 2009/0011261 A1 | 1/2009 | Gotou |
| 2009/0026072 A1 | 1/2009 | Takagi et al. |
| 2009/0133784 A1 | 5/2009 | Kugimiya et al. |
| 2009/0176113 A1 | 7/2009 | Gotoh et al. |
| 2009/0242394 A1 | 10/2009 | Takagi et al. |
| 2010/0012935 A1 | 1/2010 | Hino et al. |
| 2010/0032186 A1 | 2/2010 | Gotou et al. |
| 2010/0065847 A1 | 3/2010 | Gotou et al. |
| 2010/0163877 A1 | 7/2010 | Hino et al. |
| 2010/0207121 A1 | 8/2010 | Hino et al. |
| 2010/0231116 A1 | 9/2010 | Ochi et al. |

FOREIGN PATENT DOCUMENTS

| | | |
|---|---|---|
| JP | 62 298168 | 12/1986 |
| JP | 63 136567 | 6/1988 |
| JP | 63 136568 | 6/1988 |
| JP | 63 308384 | 12/1988 |
| JP | 64 82673 | 3/1989 |
| JP | 4 152533 | 5/1992 |
| JP | 11 283934 | 10/1999 |
| JP | 11 284195 | 10/1999 |
| JP | 11 337976 | 12/1999 |
| JP | 2000 199912 | 7/2000 |
| JP | 2003 60210 | 2/2003 |
| JP | 2003 273109 | 9/2003 |
| JP | 2005 109512 | 4/2005 |
| JP | 2008 3319 | 1/2008 |
| JP | 2008 10801 | 1/2008 |

OTHER PUBLICATIONS

U.S. Appl. No. 13/126,126, filed Apr. 26, 2011, Ochi, et al.
International Search Report issued Jul. 28, 2009 in PCT/JP09/57791 filed Apr. 17, 2009.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 13/320,673, filed Nov. 15, 2011, Tanifuji, et al.
U.S. Appl. No. 12/999,034, filed Dec. 14, 2010, Kawakami, et al.
U.S. Appl. No. 13/056,444, filed Jan. 28, 2011, Onishi, et al.
U.S. Appl. No. 13/387,522, filed Jan. 27, 2012, Goto, et al.
U.S. Appl. No. 13/387,557, filed Jan. 27, 2012, Maeda, et al.

* cited by examiner

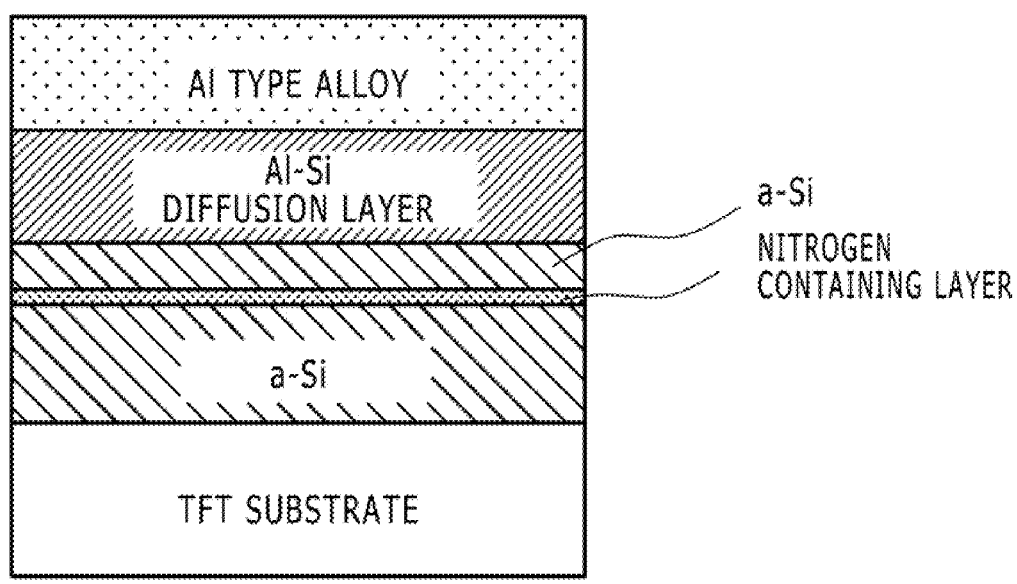

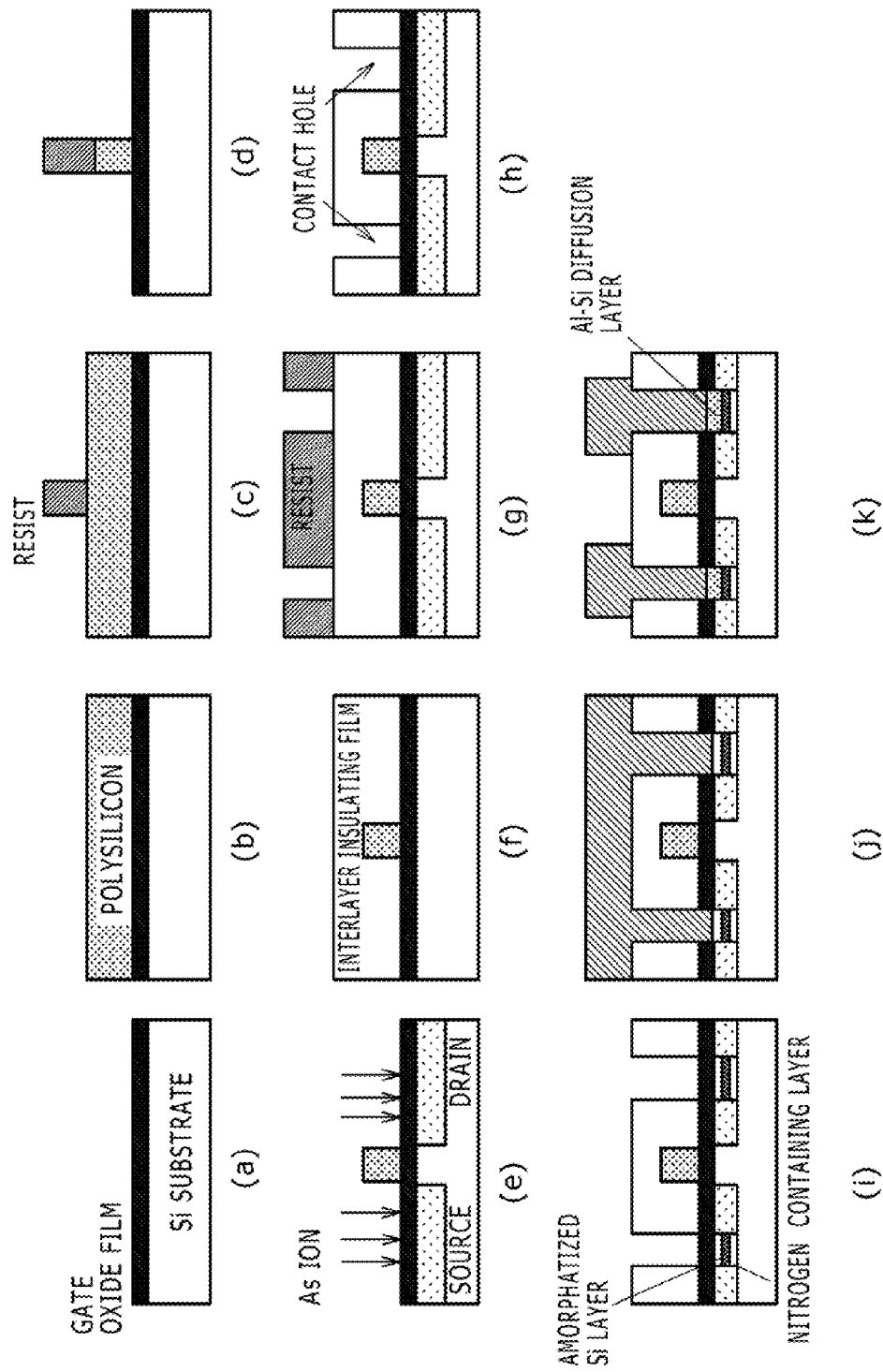

INTERCONNECTION STRUCTURE, A THIN FILM TRANSISTOR SUBSTRATE, AND A MANUFACTURING METHOD THEREOF, AS WELL AS A DISPLAY DEVICE

TECHNICAL FIELD

The present invention concerns an interconnection structure applicable to a flat panel display (display device) such as a liquid crystal display and an organic EL display; and a semiconductor device such as ULSI (Ultra-Large Scale Integrated Circuit), ASIC (Application Specific Integrated Circuit), FET (Field Effect Transistor), and a diode; a thin film transistor substrate, and a manufacturing method thereof, as well as a display device, and it particularly relates to a novel interconnection structure containing an Al type alloy film of pure Al or an Al type alloy as an interconnection material.

BACKGROUND ART

An active matrix type liquid crystal display device such as a liquid crystal display uses a thin film transistor (hereinafter referred to as the TFT) as a switching element and includes a transparent pixel electrode, an interconnection portion such as a gate interconnection, a source/drain interconnection, etc., the TFT substrate having a semiconductor layer of amorphous silicon (a-Si), polycrystal silicon (p-Si), etc., a counter substrate having a common electrode opposed to the TFT substrate at a predetermined distance, and a liquid crystal layer filled between the TFT substrate and the counter substrate.

In the TFT substrate, pure Al and an Al alloy such as Al—Nd (hereinafter referred to collectively as Al type alloy) are generally used for the interconnection material such as a gate interconnection and a source/drain interconnection with a reason that the specific resistivity is low, fabrication is easy, etc. A barrier metal layer comprising a high melting metal such as Mo, Cr, Ti, and W is usually disposed between the Al type alloy interconnection (Al type alloy film) and the TFT semiconductor layer of a TFT as typically represented by a patent document 1, etc. This is attributable to that when the Al type alloy interconnection is in direct contact with the TFT semiconductor layer of the TFT without interposition of the barrier metal layer, Al in the Al type alloy interconnection diffuses into the semiconductor layer to deteriorate TFT property by thermal hysteresis in the subsequent steps (for example, a deposition step for an insulative layer formed above the TFT or a thermal step such as sintering and annealing). Specifically, a current flowing through the TFT (off current during switching-OFF time and on current during switching-ON time), etc. undergoes an undesired effect to increase the off current and decrease the on current and, in addition, also lower the switching speed (switching-on responsivity to electric signals). Further, also the contact resistance between the Al type alloy interconnection and the semiconductor layer may sometimes also increase.

As described above, while the barrier metal layer is effective for suppressing interdiffusion between Al and Si at the boundary between the Al type alloy film and the semiconductor layer, a deposition apparatus for forming a barrier metal is additionally required in order to form the barrier metal layer in addition to the deposition apparatus for forming the Al type alloy interconnection. Specifically, extra-deposition apparatus provided with deposition chambers respectively for forming barrier metals additionally (typically, a cluster tool where a plurality of deposition chambers are connected to a transfer chamber) have to be used which increases the manufacturing cost and lowers the productivity. Further, since the fabrication speed is different between the metal used as the barrier metal layer and the Al type alloy of the fabrication steps such as wet etching using liquid chemicals, it is extremely difficult to control the fabrication size in the lateral direction in the fabrication step. Accordingly, formation of the barrier layer complicates the steps, increases the manufacturing cost and lowers the productivity not only with a view point of deposition but also with a view point of fabrication.

While descriptions have been made to an example of a liquid crystal display device as a typical example of a display device, the problem attributable to the interdiffusion between Al and Si at the boundary between the Al type alloy film and the semiconductor layer described above is observed not only in the display device but also in the semiconductor device such as LSI, FET, etc. For example, in the manufacture of LSI as a typical example of the semiconductor device, an Al type alloy film is deposited after forming a barrier metal layer such as of Cr or Mo on the semiconductor layer in order to prevent occurrence of spikes formed at the boundary between the semiconductor layer and the Al type alloy film, simplification of the steps and decrease of the cost are demanded also in the field of the semiconductor device.

Accordingly, it has been demanded for providing a technique capable of avoiding the problem due to interdiffusion between Al and Si caused in the display device or the semiconductor device without providing the barrier metal layer as in the usual case.

In view of the situations described above, patent documents 2 to 4, for example, propose a direct contact technique capable of saving the formation of the barrier metal layer and capable of direct contact of the Al type alloy interconnection used for the source/drain electrode, etc. with the semiconductor layer. Among them, the patent document 4 is disclosed by the present applicant and discloses an interconnection structure having a material comprising a nitrogen-containing layer and an Al type alloy film in which N (nitrogen) of the nitrogen-containing layer is bonded with Si in the semiconductor layer. It is considered that the nitrogen-containing layer acts as a barrier layer for preventing interdiffusion between Al and Si and it demonstrates that excellent the TFT property can be obtained without forming a barrier metal layer such as of Mo as in the existent technique. Further, since the nitrogen-containing layer can be manufactured simply and conveniently by a nitridation treatment such as plasma nitridation after forming the semiconductor layer and before depositing the Al type alloy film, it has a merit that no extra-deposition apparatus for forming the barrier film is necessary.

[Prior Art Document]
[Patent Document]
 [Patent Document 1] JP-A No. 2000-199912
 [Patent Document 2] JP-A No. 2003-273109
 [Patent Document 3] JP-A No. 2008-3319
 [Patent Document 4] JP-A No. 2008-10801

SUMMARY OF THE INVENTION

[Subject to be Solved by the Invention]

An object of the present invention is to provide a direct contact technique capable of saving a barrier metal layer between an Al type alloy interconnection of pure Al or an Al alloy and a semiconductor layer, which can connect the Al type alloy interconnection and the semiconductor layer directly and reliably in a wide range of processing margin.

[Means for Solving the Subject]

The gist of the invention is to be described below.

(1) An interconnection structure having a semiconductor layer and an Al type alloy film of pure Al or an Al alloy above a substrate sequentially from the side of the substrate, which includes a laminate structure comprising an (N, C, F) layer containing at least one element selected from the group consisting of nitrogen, carbon, and fluorine, and an Al—Si diffusion layer containing Al and Si between the semiconductor layer and the Al type alloy film sequentially from the side of the substrate, and in which at least one element of nitrogen, carbon, and fluorine contained in the (N, C, F) layer is bonded with Si contained in the semiconductor layer.

A preferred embodiment of the interconnection structure (1) described above includes an interconnection structure having a semiconductor layer and an Al type alloy film of pure Al or an Al alloy above a substrate sequentially from the side of the substrate, which includes a laminate structure comprising an (N, C, F) layer containing at least one element selected from the group consisting of nitrogen, carbon, and fluorine, and an Si-containing Al—Si diffusion layer between the semiconductor layer and the Al type alloy film sequentially from the side of the substrate, and in which at least one element of nitrogen, carbon, and fluorine contained in the (N, C, F) layer is bonded with Si contained in the semiconductor layer.

(2) An interconnection structure described in (1), including a semiconductor layer substantially consisting only of Si between the (N, C, F) layer and the Al—Si diffusion layer.

(3) An interconnection structure described in (1) or (2), wherein the Al—Si diffusion layer is obtained by forming the (N, C, F) layer, the semiconductor layer, and the Al type alloy film in this order and then applying thermal hysteresis.

(4) An interconnection structure described in any one of (1) to (3), wherein the semiconductor layer contains amorphous silicon or polycrystal silicon.

A preferred embodiment of the interconnection structure (4) described above includes an interconnection structure, wherein the semiconductor layer contains amorphous silicon or polycrystal silicon.

(5) A thin film transistor substrate having the interconnection structure according to any one of (1) to (4).

(6) A display device having the thin film transistor described in (5).

(7) An interconnection structure as described in any one of (1) to (4) constituting a display device or a semiconductor device.

(8) A method of manufacturing a thin film transistor described in (5), including a first step of forming an (N, C, F) layer containing at least one element selected from the group consisting of nitrogen, carbon, and fluorine above a semiconductor layer of a thin film transistor and then a second step of subsequently forming a semiconductor layer in this order.

(9) A manufacturing method described in (8), wherein the first step is applied in the semiconductor forming apparatus.

(10) A manufacturing method described in (9), wherein the first step and the second step are carried out continuously in one identical semiconductor layer forming chamber.

(11) A manufacturing method described in any one of (8) to (10), wherein the first step includes a step of forming the (N, C, F) layer by plasma etching using a gas containing at least one element selected from the group consisting of nitrogen, carbon, and fluorine.

(12) A manufacturing method described in any one of (8) to (10), wherein the first step includes a step of forming the (N, C, F) layer by plasma etching using a gas mixture comprising a gas containing at least one element selected from the group consisting of nitrogen, carbon, and fluorine, and a starting material gas used for forming the semiconductor layer.

[Effect of the Invention]

The present invention can provide a direct contact technique capable of bringing an Al type alloy film of pure Al or an Al alloy into direct contact with a semiconductor layer, which is not only excellent in the TFT property and the contact resistance between the Al type alloy film and the semiconductor layer but also has good productivity and further extended processing margin. Specifically, it can provide a technique less undergoing the effects of scattering of various processing conditions (for example, scattering of apparatus performance, instability, unexpected contamination, contamination difficult for control, etc.), not requiring extremely stringent control for conditions, and less undergoing the restriction for processing conditions.

BRIEF DESCRIPTION OF THE DRAWINGS

FIG. 2 is a schematic cross sectional explanatory view showing the constitution of a TFT according to a second embodiment of the invention.

FIG. 13 is a step chart for explaining the steps of manufacturing an interconnection structure of Example 13.

EMBODIMENT FOR CARRYING OUT THE INVENTION

Figure 1A:
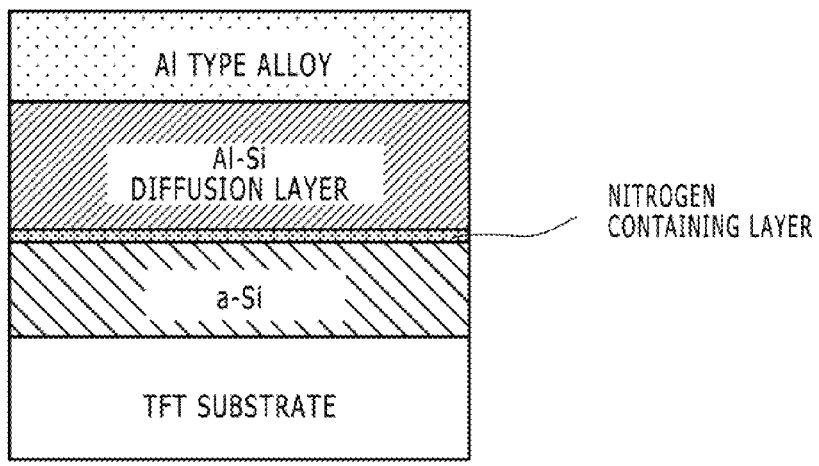
FIG. 1A is a schematic cross sectional explanatory view showing the constitution of a TFT according to a first embodiment of the invention.

The present invention further improves and develops the direct contact technique of the patent document 4 for the extension of the processing margin. Specifically, the invention is based on the effect disclosed by the patent document 4 of preventing the interdiffusion between Al and Si by the nitrogen-containing layer and has a characteristic feature of providing an interconnection structure including a lamination structure in which an Al—Si diffusion layer containing Al and Si having a function as a cover layer for protecting the nitrogen-containing layer against the atmospheric air is laminated above the nitrogen-containing layer. The Al—Si diffusion layer is formed by forming an (N, C, F) containing layer, a semiconductor layer, and an Al type alloy film successively and then by thermal hysteresis applied at about 150° C. or higher in the manufacturing step of a TFT and comprises Al of the Al type alloy film and Si of the semiconductor layer.

At first, the background in which the present invention has been attained is to be described.

The present inventor has made further studies with a view point of mainly improving the productivity after disclosure of the patent document 4. As described above, the direct contact technique of the patent document 4 includes a constitution in which the semiconductor layer and the Al type alloy film are in direct contact by way of the nitrogen-containing layer and it is considered that the nitrogen-containing layer acts as a barrier layer capable of preventing interdiffusion between Si and Al. For obtaining the structure described above, a semiconductor layer and a nitrogen-containing layer are formed at first in a chamber for forming a semiconductor layer such as a plasma CVD apparatus (under vacuum) and then the processing is carried out by transferring them to a chamber used exclusively for depositing the Al type alloy film by a sputtering method or the like (under vacuum). According to the result of the studies made by the present inventors, it has been found that when the surface of the nitrogen-containing layer is excessively contaminated, for example, by contact with the atmospheric air, this gives an undesired effect on the electric property to result in problems such as deterioration of TFT property and increase of the contact resistance between the semiconductor layer and the Al type alloy film, or scatterings thereof. Then, as a result of further investigations for avoiding such problems, the following constitutions (I) to (IV) have been attained to accomplish the invention.

(1) The manufacturing method of the invention has a characteristic feature in that the Al type alloy film is not deposited directly on the nitrogen-containing layer as in the patent document 4 but an (N, C, F) layer typically represented by a nitrogen-containing layer, etc. is formed and, subsequently, a semiconductor layer is continuously deposited further above the (N, C, F) layer successively within an identical chamber. It has been found that after conducting the method described above, when they are transferred to the chamber used exclusively for the Al alloy film, the Al type alloy film is deposited and, then, a TFT is manufactured by a known methods in the same manner as in the patent document 4, the semiconductor layer is transformed by the subsequent thermal hysteresis into an Al—Si diffusion layer (to be described specifically in (II) later) to eliminate the problems of deterioration of TFT property and increase of the contact resistance or scattering thereof due the contamination of the (N, C, F) layer and, as a result, the semiconductor layer and the Al type alloy film of the TFT can be connected directly and reliably to provide a direct contact technique having good electric property (refer to examples to be described later).

The semiconductor layer is used in the invention because simplification of the deposition step has been mainly taken into consideration. Since all of the series of steps of depositing the semiconductor layer (not a semiconductor layer transformed into the Al—Si diffusion layer but the semiconductor layer formed on the TFT substrate), an (N, C, F) layer, and the semiconductor layer above the TFT substrate can be performed continuously in one identical chamber, there is no possibility that they are exposed to the atmospheric air.

(II) The interconnection structure of the invention obtained by the method described above is different from the structure of the patent document 4 but has a lamination structure in which an Al—Si diffusion layer containing Al and Si is laminated above the (N, C, F) layer as shown, for example, in FIG. 1A. The Al—Si diffusion layer is formed by thermal hysteresis applied in the TFT manufacturing step after forming the (N, C, F) layer, the semiconductor layer, and the Al type alloy film successively and obtained by diffusion of Al in the Al type alloy film to Si in the semiconductor layer by the heat treatment at about 150° C. or higher (preferably, 180° C. or higher). The Al—Si diffusion layer obtained as described above comprises Al of the Al type alloy film and Si of the semiconductor layer and has a role as a cover layer for protecting the (N, C, F) layer against the atmospheric layer. The Al—Si diffusion layer may be formed directly on the (N, C, F) layer as shown in Example 1 to be described later and in FIG. 1A but this is not limitative. For example, a semiconductor layer not substantially containing Al (semiconductor layer substantially consisting only of Si) may also be present between the (N, C, F) layer and the Al—Si diffusion layer as shown in Example 2 to be described layer and in FIG. 2. The latter embodiment is formed when this is manufactured under the condition where interdiffusion between Si of the semiconductor layer and Al of the Al type alloy film does not proceed sufficiently. Specifically, this is obtained, for example, by controlling the deposition condition of the semiconductor layer formed above the (N, C, F) layer (for example, the semiconductor layer is deposited to a large thickness by extending the deposition time), controlling the composition of the Al type alloy film formed above the semiconductor layer (for example, by using a transition metal that makes interdiffusion difficult between Al and Si).

Figure 9:
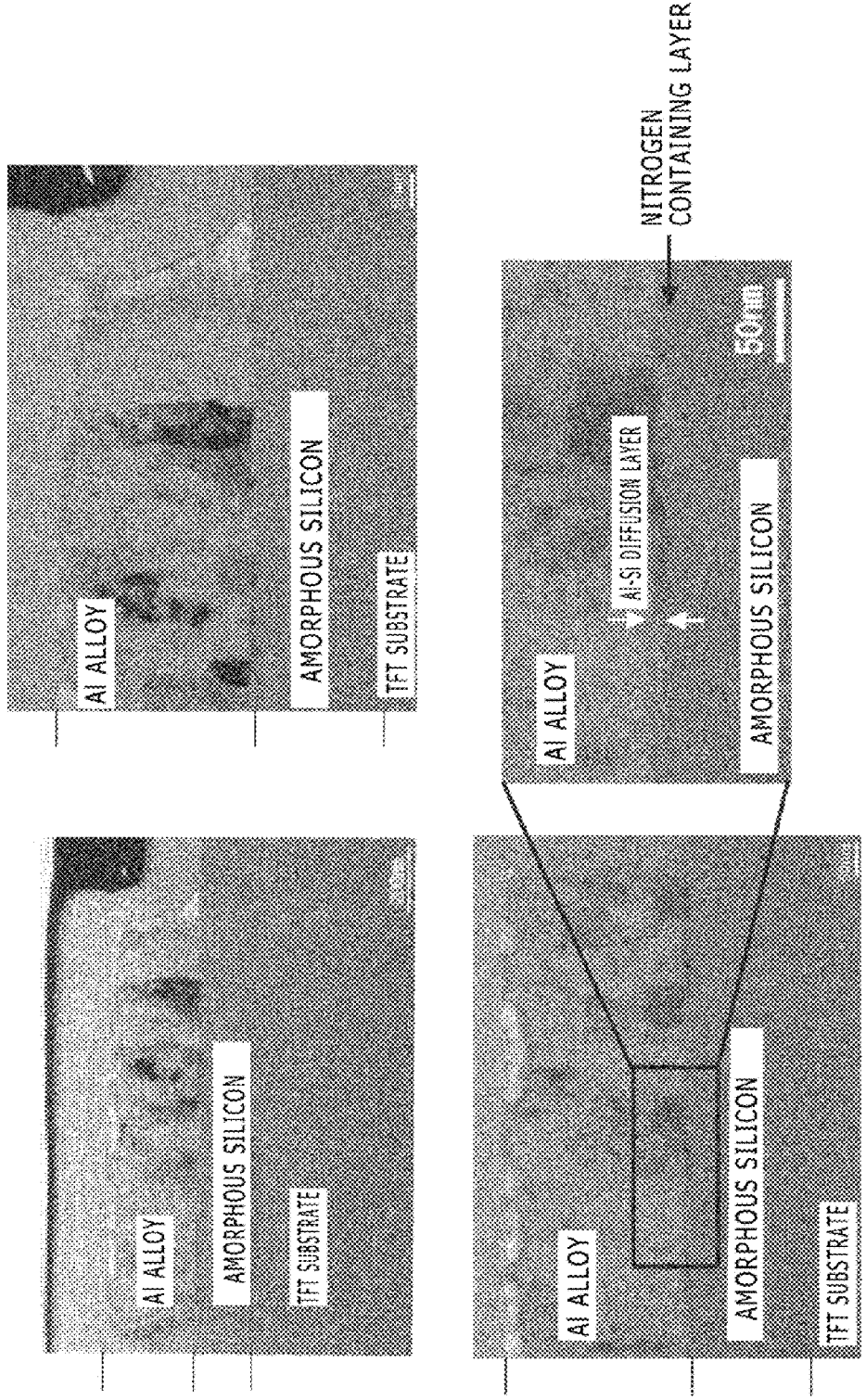
FIG. 9 shows cross sectional TEM photographs for a boundary between an amorphous silicon and an Al type alloy film in Example 1.

For the reference, FIG. 9 shows the outline of the Al—Si diffusion layer obtained by the method of the invention. FIG. 9 shows cross sectional TEM photographs (300,000×) for Example 1 to be described later (this example), in which a thin Al—Si diffusion layer (about 10 nm in this embodiment) is formed continuously between the semiconductor layer (a-Si) and the Al type alloy film. According to this example, since diffusion of Al atoms into the semiconductor layer can be suppressed effectively, Al atoms were not detected in the semiconductor layer. Therefore, it has been confirmed that interdiffusion between Al and Si at the boundary can be prevented according to the method of the invention in the same manner as in the patent document 4.

(III) This invention discloses an (N, C, F) layer as a barrier layer having a function of preventing interdiffusion between Al and Si. While the patent document 4 described above discloses only the nitrogen-containing layer as a barrier layer for preventing interdiffusion between Al and Si, it was experimentally confirmed according to the subsequent studies made by the present inventor that the effect is not restricted only to that of the nitrogen-containing layer but also the layers containing carbon and fluorine can provide the same effect and, more specifically, that all of (N, C, F) layers containing at least one element selected from the group consisting of nitrogen, carbon, and fluorine can provide substantially the same effect as that of the nitrogen-containing layer. As described above, the invention further develops the technique of the patent document 4 in that the (N, C, F) layer is used as the barrier layer.

(IV) It has been found that the technique of the invention is extremely useful as the technique of preventing interdiffusion between Al and Si at the boundary between the Al type alloy film and the semiconductor layer, and this is applicable not only to the display device such as a liquid display device but also to a semiconductor device such as an LSI or an FET (refer to examples to be described later).

The invention is to be described specifically. As described above, the invention is a technique that improves the patent document 4 and a portion of the lamination structure and a portion of the manufacturing method are overlapped between them. In the present specification, description is to be made while particularly emphasizing the points difference from the patent document 4 and descriptions for overlapped portions (for example, method of forming the nitrogen-containing layer) may be sometimes summarized without describing them specifically. For the details of the overlapped portions, the patent document 4 may be referred to.

At first, the interconnection structure and the manufacturing method thereof of the invention are to be described with reference to FIG. 1A to FIG. 1C and FIG. 2 to FIG. 4. The interconnection structure of the invention has a semiconductor layer and an Al type alloy layer of pure Al or an Al alloy above a substrate sequentially from the side of the substrate which includes a laminate structure of an (N, C, F) layer containing at least one element selected from the group consisting of nitrogen, carbon, and fluorine, and an Al—Si diffusion layer containing Al and Si between the semiconductor layer and the Al type alloy film from sequentially the side of the substrate. It may suffice that the lamination structure is provided at least between the semiconductor layer and the Al type alloy film and, for example, the lamination structure may also be provided directly on the semiconductor layer as shown in FIG. 1A to FIG. 1O and FIG. 2. That is, the interconnection structure of the invention may have a plurality of the (N, C, F) layers. However, this is not limitative but an embodiment having the semiconductor layer, the (N, C, F) layer, and the semiconductor layer and having the lamination structure thereabove sequentially from the side of the substrate is also included within the range of the invention. The invention is not restricted to the embodiments. In the drawings described above and in the drawings to be described later, "nitrogen-containing layer" is described instead of the (N, C, F) layer as a representative layer thereof but this is a preferred embodiment with no intention for restriction.

Then, as will be described repetitively, the characteristic feature of the invention is to have the Al—Si diffusion layer above the (N, C, F) layer in comparison with the patent document 4. The Al—Si diffusion layer may be disposed directly or (just above) the (N, C, F) layer (refer to Example 1 and FIG. 1A) or may be formed with interposition of a semiconductor layer not substantially containing Al (that is, a semiconductor layer substantially consisting only of Si) (refer to Example 2 and FIG. 2). Any of the embodiments is included within the range of the invention. Such an Al—Si diffusion layer is obtained by forming the (N, C, F) layer, the semiconductor layer, and the Al type alloy film sequentially and then applying thermal hysteresis at about 150° C. or higher.

First to fifth embodiments of the interconnection structure according to the present invention are to be described specifically with reference to the drawings. Descriptions are to be made using embodiments 1 to 4 of TFTs as typical examples of a display device and an embodiment 5 of an MOSFET as a typical example of a semiconductor layer, to which the lamination structure of the invention is to be applied but the invention is not restricted to them. Further, the type of the semiconductor layer may be either amorphous silicon or polycrystal silicon.

For explaining the manufacturing steps of the interconnection structure, a term "semiconductor layer" is used repetitively. However, since a semiconductor layer deposited above the (N, C, F) layer, which is a semiconductor layer capable of being transformed finally into an Al—Si diffusion layer that can protect the (N, C, F) layer from the atmospheric air by the subsequent thermal hysteresis is different in function and the effect from a semiconductor layer, etc. formed directly on the TFT substrate which is a semiconductor not having the protecting effect for the (N, C, F) layer, the former semiconductor that can act as the protecting layer is to be referred to as "second semiconductor layer" and the latter semiconductor layer is sometimes referred to as "first semiconductor layer" for the convenience of the explanation. As shown in Example 2 to be described layer and in FIG. 2, the second semiconductor layer is not sometimes transformed entirely into the Al—Si diffusion layer but remains depending on the TFT manufacturing conditions.

First Embodiment of the Invention

FIG. 1A shows a first embodiment of a TFT according to the invention. FIG. 1A has a structure having a first semiconductor layer above the TFT substrate, has a two layered lamination structure comprising an (N, C, F) layer and an Al—Si diffusion layer directly thereon, and has a structure in which an Al type alloy layer is formed directly thereon. The structure of FIG. 1A is obtained by forming a second semiconductor layer after forming the (N, C, F) layer, and then applying thermal hysteresis at about 150° C. or higher and can be obtained, for example, by a method of Example 1 to be described layer.

In the first embodiment, the (N, C, F) layer constituting the interconnection structure contains one of elements of nitrogen, carbon, and fluorine. Since the (N, C, F) layer is formed so as to substantially cover the entire surface of the semiconductor layer, it effectively acts as a barrier for preventing interdiffusion between Al and Si at the boundary between the Al type alloy and the semiconductor layer. This is preferably a nitrogen-containing layer. Specifically, nitrogen, carbon, or fluorine constituting the layer is bonded with Si of the semiconductor layer, and Si nitride, Si carbide, and Si fluoride are mainly contains. In addition, it can also contain a compound of Si oxynitride containing oxygen. Si oxynitride, etc. can be obtained, for example, by bonding with oxygen (O) which is inevitably introduced in the process of forming the nitrogen-containing layer, etc.

Preferably, the total for the surface density of nitrogen atoms, carbon atoms, and fluorine atoms contained in the (N, C, F) layer is identical with the surface density of effective bonds of the semiconductor layer material (typically, Si) or has a surface density higher than the surface density of the effective bonds. As has been described specifically in the Patent Document 4, for preventing interdiffusion between the metal interconnection material and the semiconductor material, it is necessary to cover the surface of the semiconductor layer with the (N, C, F) layer such as a nitrogen-containing layer. In this case, free bonds present at the surface of the semiconductor layer (dangling bonds) preferably bond with each of the elements constituting the layer described above. "Effective bond" means a bound that can be disposed on the surface of the semiconductor layer while considering also the steric hindrance of nitrogen atom, carbon atom, or fluorine atom, and "surface density of effective bounds" means a surface density when the entire surface of the semiconductor layer is covered with the (N, C, F) layer. The surface density of the effective bonds is different depending on the type of the semiconductor material, etc. and in a case of silicon, for example, it is substantially within a range from $10^{14}$ cm$^{-2}$ to $2 \times 10^{16}$ cm$^{-2}$ although somewhat different depending on the plane of crystals.

Specifically, both in a case where the nitrogen-containing layer mainly contains an Si nitride and in a case where it mainly contains an Si nitride and further contains Si oxynitride, for example, it is preferred that nitrogen in the nitrogen-containing layer preferably has a surface density (N1) of $10^{14}$ cm$^{-2}$ or more and $2 \times 10^{16}$ cm$^{-2}$ or less at the boundary in contact with the semiconductor layer. For ensuring a desired TFT property, the lower limit for the surface density of nitrogen of the nitrogen-containing layer is more preferably $2 \times 10^{14}$ cm$^{-2}$ and, further preferably, at $4 \times 10^{14}$ cm$^{-2}$. In the same manner, carbon of the carbon-containing layer has a surface density (C1) preferably of $10^{14}$ cm$^{-2}$ or more and $2 \times 10^{16}$ cm$^{-2}$ or less, more preferably, $2 \times 10^{14}$ cm$^{-2}$ or more and, further more preferably, $4 \times 10^{14}$ cm$^{-2}$ or more at the boundary in contact with the semiconductor layer. Further, in the same manner as described above, fluorine of the fluorine-containing layer has the surface density (F1) preferably of $10^{14}$ cm$^{-2}$ or more and $2 \times 10^{16}$ cm$^{-2}$ or less, more preferably, $2 \times 10^{14}$ cm$^{-2}$ or more and, further more preferably, $4 \times 10^{14}$ cm$^{-2}$ or more at the boundary in contact with the semiconductor layer.

The (N, C, F) layer may have at least one layer containing Si—N bond, Si—C bond, and Si—O bond. The distance between Si and N (interatom distance) in the Si—N bond is about 0.18 nm and the nitrogen-containing layer is preferably 0.2 nm or more and more preferably, 0.3 nm or more substantially. However, when the surface density of nitrogen (N1) of the nitrogen-containing layer is excessively high, insulative Si nitride contained in the nitrogen-containing layer also increases and the electric resistance is increased to deteriorate the TFT performance. The upper limit of the surface density of nitrogen in the nitrogen-containing layer is more preferably $1 \times 10^{16}$ cm$^{-2}$. With an identical point of view, the distance between Si and C (interatom distance) of the Si—C bond is about 0.19 nm or less and the carbon-containing layer is preferably 0.2 nm or more and more preferably, 0.3 nm or more. Further, the upper limit of the surface density of carbon in the carbon-containing layer is more preferably $1 \times 10^{16}$ cm$^{-2}$. With an identical point of view, distance between Si and F (interatom distance) of the Si—F bond is about 0.16 nm and the fluorine-containing layer is preferably about 0.18 nm or more and, more preferably, 0.25 nm or more. Further, the upper limit of the surface density of the fluorine of the fluorine-containing layer is more preferably $1 \times 10^{16}$ cm$^{-2}$.

In a case where the (N, C, F) layer contains an oxygen-containing compound such as Si oxynitride (for example, in a case of further containing Si oxide in addition to Si nitride), the total for the surface density of each of the elements constituting the layer preferably satisfies the requirements described above and the total for the ratio of the surface density of each of the elements (N1, C1, F1) to the oxygen surface density (O1) [(N1+C1+F1)/O1] is preferably 1.0 or more, which further improves the TFT property. While the nitrogen-containing compound such as Si nitride and oxygen-containing compounds such as Si oxynitride are insulative material by nature, since the thickness of the (N, C, F) layer is as thin as about 0.18 nm or more and 5 nm or less as will be described later, the electric resistance can be kept low.

According to the result of the experiment made by the present inventor, it has been found that the TFT property undergoes the effect of the ratio: [(N1+C1+F1)/O1] and that the ratio [(N1+C1+F1)/O1] may be made greater as 1.05 or more in order to obtain more excellent the TFT property. It is considered that good transistor property can be obtained as the ratio: [(N1+C1+F1)/O1] increases since the resistive component in the (N, C, F) layer decreases. A higher ratio: [(N1+C1+F1)/O1] is more preferred and, for example, it is more preferably 1.05 or more and, further preferably, 1.1 or more.

The ratio: [(N1+C1+F1)/O1] can be controlled for example, by properly controlling the plasma generation conditions such as the gas pressure, the gas composition, and the processing temperature of plasmas upon forming the nitrogen-containing layer by using a plasma nitrization method.

The nitrogen surface density (N1), the carbon surface density (C1), the fluorine surface density (F1), and the oxygen surface density (O1) in the (N, C, F) layer described above can be calculated by using, for example, RBS (Rutherford Backscattering Spectrometry).

The thickness of the (N, C, F) layer is preferably within a range of about 0.18 nm or more and 5 nm or less. As described above, while the (N, C, F) layer is useful as a barrier layer for preventing interdiffusion of Al and Si at the boundary between the Al type alloy layer and the semiconductor layer, since the (N, C, F) layer tends to become an insulator, the electric resistance increases extremely and, in addition, the TFT performance is deteriorated when the thickness is excessively large. By controlling the thickness of the (N, C, F) layer within the range described above, increase of the electric resistance due to the formation of the (N, C, F) layer can be suppressed within a range not giving undesired effects on the TFT performance. The thickness of the (N, C, F) layer is more preferably about 3 nm or less, further preferably, 2 nm or more and, furthermore preferably, 1 nm or less. The thickness of the (N, C, F) layer can be determined by various physical analysis methods and, for example, an XPS (X-ray photoelectron spectroscopy) method, an SIMS (secondary ion mass spectrometry) method, or a GD-OES (RF glow-discharge emission spectroscopy) method can be utilized in addition to the RBS method described above.

The maximum value of the ratio between the number of atoms for each of the elements constituting the (N, C, F) layer and the number of atoms of Si is preferably within a range of 0.5 or more and 1.5 or less. This can provide the barrier effect of the (N, C, F) layer effectively without deteriorating the TFT property. The maximum value of the ratio described above is more preferably 0.6 or more and, further preferably, 0.7 or more. The ratio can be controlled for example, by controlling the plasma irradiation time within a range of about 5 sec to 10 min. The ratio is calculated by analyzing the elements (N, C, F, and Si) in the direction of the depth of the (N, C, F) layer by the RBS method.

For forming the (N, C, F) layer, at least one of nitrogen, carbon, and fluorine may be supplied to the surface of the semiconductor layer after forming the semiconductor layer. Specifically, the layer described above can be formed by utilizing plasmas containing one of them. Alternatively, as described in the Patent Document 4, the nitrogen-containing layer may also be formed by using a thermal nitridation method or an amination method. For the details of the thermal nitridation method or the amination method, the patent document 4 may be referred to.

The method of utilizing plasmas is to be described in details. For the plasmas, a gas containing at least one of nitrogen, carbon, and fluorine can be used. The utilizable gas includes, for example, nitrogen-containing gases such as $N_2$, $NH_3$, $N_2O$, NO, etc.; nitrogen-fluorine-containing gases such as $NF_3$; carbon-containing gases such as CO, $CO_2$, hydrocarbon-type gases (for example, $CH_4$, $C_2H_4$, $C_2H_2$, etc.); fluorocarbide type gases (for example, $CF_4$, $C_4F_8$, etc.), and carbon-fluorine-containing gases such as $CHF_3$. The gases may be used each alone or as a gas mixture.

Further, a method of supplying at least one of nitrogen, carbon, and fluorine from a plasma source containing the gas described above to the surface of the semiconductor layer includes, for example, a method which is conducted while disposing the semiconductor layer near the plasma source. The distance between the plasma source and the semiconductor layer may be set properly in accordance with various parameters such as plasma species, plasma generation power, pressure, temperature, etc. and, generally, a distance from several cm to 10 cm from the state in contact with the plasmas can be utilized. In the vicinity of the plasmas described above, atoms having a high energy are present and nitrides, carbides, fluorides, etc. can be formed on the surface of the semiconductor by supplying nitrogen, carbon, fluorine, etc. to the surface of the semiconductor layer by the high energy described above.

In addition to the method described above, an ion implantation method can be utilized for instance. According to the method, since ions are accelerated and can be transferred for a long distance by electric fields, the distance between the plasma source and the semiconductor layer can be set optionally. The method can be attained by utilizing an apparatus used exclusively for ion implantation and a plasma ion implantation method is used preferably. The plasma ion implantation method is a technique of uniformly implanting ions by applying high negative voltage pulses to a semiconductor layer disposed near the plasmas.

Upon forming the (N, C, F) layer, the method is conducted preferably while controlling the apparatus or the chamber, and the temperature or the gas composition used for forming the layer with a view point of simplifying the manufacturing steps and shortening the processing time.

At first, referring to the apparatus, the processing is preferably conducted by an apparatus identical with a semiconductor layer forming apparatus in order to simplify the manufacturing steps and, more preferably, conducted in one identical chamber of an identical apparatus. This can eliminate the requirement of additionally moving a work as a target for processing between the apparatus or in the apparatus. Referring to the temperature, the processing is preferably performed at a temperature substantially identical with the deposition temperature of the semiconductor layer (range of about ±10° C. can be included), thereby saving the control time accompanying the temperature fluctuation.

Further, referring to the gas composition, (I) the (N, C, F) layer may be formed by using a gas containing at least one element selected from the group consisting of nitrogen, carbon, and fluorine (nitrogen-containing gases, carbon-containing gases, and fluorine-containing gases, etc. described above), (II) the (N, C, F) layer may be formed by using a gas mixture of a gas containing at least one element selected from the group consisting of nitrogen, carbon, and fluorine, and a starting material gas used for forming the semiconductor layer, or (III) the (N, C, F) layer may be formed by using a gas mixture of a gas containing at least one element selected from the group consisting of nitrogen, carbon, and fluorine, and a reducing gas. For example, in a case of forming the nitrogen-containing gas, the processing can be conducted by using only the nitrogen-containing gas containing at least nitrogen ($N_2$, $NH_3$, $NF_3$, etc.) as described in (I) above and it is preferably a gas mixture of the nitrogen-containing gas and a starting material gas ($SiH_4$) used for forming the semiconductor layer as in (II) described above. In a case of forming the nitrogen-containing layer by using only the nitrogen-containing gas, all the gases for forming the semiconductor layer have to be discharged once for purging the inside of the chamber after forming the semiconductor layer. When the processing is conducted under the condition of the gas mixture as described above, the processing time can be shortened since it is no more necessary to exhaust the gases.

In (II) described above, the flow rate ratio between the gas containing at least one element selected from the group consisting of nitrogen, carbon, and fluorine (hereinafter simply referred to as "(N, C, F) gas", particularly, nitrogen-containing gas) and a starting material gas used for forming the semiconductor layer (hereinafter simply referred to as "semiconductor starting material gas"(((N, C, F) gas/semiconductor starting material gas) is preferably controlled to 0.1 or more and 15 or less, by which the effect of shortening the processing time can be provided effectively, and deterioration of the TFT property (ON current-OFF current) and increase of the contact resistance can be prevented. When the (N, C, F) gas is insufficient, the effect of preventing interdiffusion between Al and Si cannot be provided effectively and, on the other hand, when the (N, C, F) gas is excessive, bonding in the thin film layer is instable. A more preferred flow rate ratio of ((N, C, F) gas/semiconductor starting material gas) is 0.3 or more and 10 or less and a more preferred flow rate ratio is 0.5 or more and 7 or less.

Alternatively, the gas composition is preferably a gas mixture of the nitrogen-containing gas and the reducing element gas as in (III) described above and this can suppress oxidation of the semiconductor layer more effectively. The reducing gas includes, for example, $NH_3$ and $H_2$. Among them, since $NH_3$ not only has the reducing effect but also acts as the nitrogen-containing gas, it can be used alone but may also be used in admixture with $H_2$.

Then, the Al type alloy used in the invention is to be described. The Al type alloy may be formed, for example, by a sputtering method. In the invention, it can be formed by using a single sputtering target and a single sputtering gas.

The type of the Al type alloy used in the invention is not particularly restricted, and Al materials that have been used so far generally such as those used usually as the interconnection material such as for source/drain interconnections, for example, pure Al and Al alloys containing, for example, Si, Cu, and rare earth elements (typically, Nd, Y, etc.) as alloying ingredients can be used so long as they give no undesired effects on the electric property such as TFT property.

Further, in the invention, Al—Ni alloy containing Ni in a range preferably of 6 atom % or less (more preferably, 5 atom % or less) and Al—Ni—X1 alloy/Al—Ni—X2 alloy/Al—Ni—X1-X2 alloy further containing the following third ingredient (element belonging to group X1 or group X2) can also be used. In a case of using the latter Al—Ni—Z1 alloy, etc., it is preferred that the lower limit of Ni is 0.05 atom % (preferably, 0.1 atom %). In this case, "group X1" is at least one element selected from the group consisting of Ti, V, Zr, Nb, Mo, Hf, Ta, and W, and may be contained, preferably, within a range of 0.1 atom % or more and 1.0 atom % or less and, more preferably, within a range of 0.2 atom % or more and 0.8 atom % or less. The elements may be added each alone or two or more of them may be used in combination. When two or more types of elements are added, the content for the sum of each of the elements may satisfy the range described above. Further, "group X2" is at least one element selected from the group consisting of Mg, Cr, Mn, Ru, Rh, Pd, Ir, Pt, La, Gd, Tb, Dy, Nd, Y, Co, and Fe, and may be contained, preferably, within a range of 0.1 atom % or more and 2.0 atom % or less and, more preferably, within a range of 0.3 atom % or more and 1.8 atom % or less. The elements may be added each alone or two or more of them may be used in combination. When two or more of the elements are added, the content for the sum of each of the elements may satisfy the range described above. In the invention, the Al—Ni—X1-X2 alloy containing both of the elements belonging to the group X1 and the group X2 can also be used.

As described above, each of the elements belonging to the groups X1 and X2 described above is selected with a view point of the heat resistance and the electric resistivity of the Al—Ni—X1 alloy thin film/Al—Ni—X2 alloy thin film. The mechanism regarding the heat resistance is somewhat different between the group X1 and the X2. That is, it is considered that the elements belonging to the group X1 have higher effect of improving the heat resistance by so much as the deposition of an intermetallic compound is delayed compared with the elements belonging to the group X2, so that a sufficient effect for improving the heat resistance can be obtained even when the addition amount is restricted to a relatively small amount.

The Al type alloy used in the invention may also contain at least one element selected from the group X3 for Ni, Ag, Zn, Co and at least one element selected from the group X4 capable of forming intermetallic compound with X3 described above (Cu, Ge, Si, Mg, In, Sn, and B). In the Al type alloy, an intermetallic compound represented by X3-X4 or Al—X3-X4 with a maximum diameter of 150 nm or less is formed. It is preferably an Al—(Ni, Co)—(Cu, Ge) alloy. Further, the Al type alloy described above contains at least one heat resistance improving element selected from the group X5 for La, Nd, Gd, and Dy.

While the thickness of the Al type alloy layer can be controlled properly in accordance with necessary TFT property, etc. Generally, it is preferably form 10 nm to 1 μm, more preferably, 30 nm to 800 nm and, further preferably, from 50 nm to 600 nm.

Further, while the thickness of the Al—Si diffusion layer can also be controlled properly in accordance with the required the TFT property, etc. in the same manner as described above. Generally, it is preferably within a range from 0.2 nm or more and 200 nm or less. More specifically, the upper limit was determined to about 200 nm with a view point that it may be preferably larger than the thickness corresponding to one layer of Al—Si atoms (about 0.2 nm) and preferably as thin as possible with a view point of manufacturing the TFT.

The semiconductor layer used in the invention is preferably of amorphous silicon or polycrystal silicon. When the semiconductor layer contains an impurity (dopant) such as P, As, Sb, B, etc. generally used in the field of semiconductors, the atom concentration is preferably $10^{19}$ cm$^{-3}$ in total thereby capable of further decreasing the contact resistance. Further, also in a case where the atom concentration described above is $10^{15}$ cm$^{-3}$ or less and the dopant is not contained, a good TFT property can be obtained without greatly increasing the contact resistance. In this case, a merit capable of saving the cost and the manufacturing steps can be obtained since the doping gas is not used.

A preferred thickness of the semiconductor layer is from 0.2 nm to 1 μm which substantially corresponds to that of the silicon atom layer. A more preferred thickness of the semiconductor layer is from 0.5 nm to 500 nm and, further preferably, from 1 nm to 300 nm.

The embodiment shown in FIG. 1A has been described specifically above.

Figure 1B:
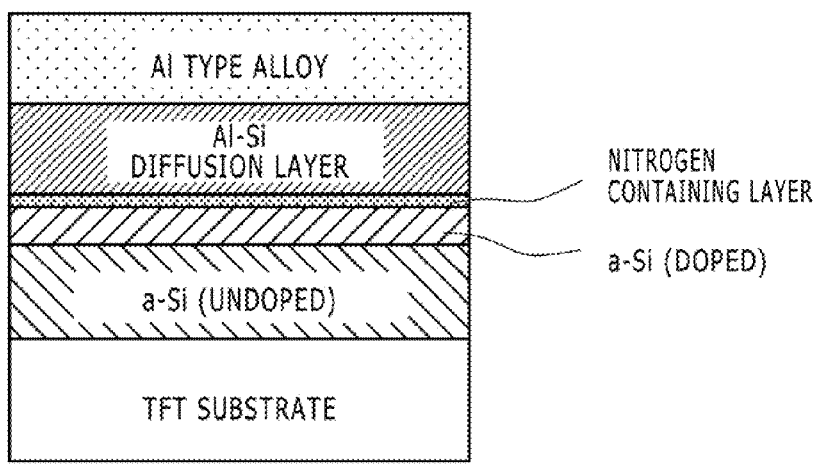
FIG. 1B is a schematic cross sectional explanatory view showing the constitution of the TFT according to a first embodiment of the invention.
Figure 1C:
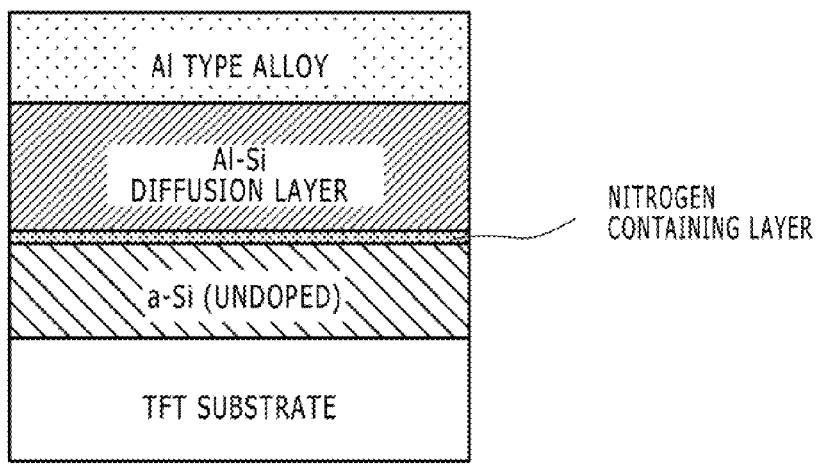
FIG. 1C is a schematic cross sectional explanatory view showing the constitution of the TFT according to a first embodiment of the invention.

The embodiment of FIG. 1A can include both the cases of FIG. 1B and FIG. 1C depending on the constitution of the first semiconductor layer formed above the TFT substrate. Among them, the first semiconductor layer in FIG. 1B includes a non-doped amorphous silicon film (a-Si—H) with no addition of an impurity such as P, As, Sb, or B, and a low resistance amorphous silicon film (n$^+$a-Si—H) containing the impurity described above and it is obtained, for example, by the method of Example 1 to be described later. On the other hand, the first semiconductor layer in FIG. 1C does not contain the low resistance amorphous silicon film (n$^+$a-Si—H) and consists only of the non-doped amorphous silicon film (a-Si—H). It has been confirmed by the experiment that a desired Al—Si diffusion layer is obtained by forming a nitrogen-containing layer, a second semiconductor layer, and an Al type alloy layer successively above a first semiconductor layer not having a low resistance amorphous silicon film (n$^+$a-Si—H) as shown in FIG. 1C (refer to the example to be described later). The method of the invention has an advantage capable of simplifying the deposition steps more in that a low resistance amorphous silicon film (n$^+$a-Si—H) having an impurity such as phosphorous doped thereto may not be formed additionally.

Although not illustrated in the drawing, the second semiconductor layer formed above the nitrogen-containing layer may consists only of a low resistance amorphous silicon film containing an impurity such as P as shown in Example 1 to be described later, or may be comprised of a non-doped amorphous silicon film and the low resistance amorphous silicon film described above and the embodiment may include both of them. The low resistance amorphous silicon film is formed, for example, by conducting plasma CVD using SiH$_4$ and PH$_3$ as the starting material.

Second Embodiment of the Invention

The second embodiment of TFT according to the invention is a modified example of the Al—Si diffusion layer in the first embodiment described above, which is an example having a three-layered lamination structure as shown in FIG. 2. Specifically, since TFT is manufactured under the conditions where interdiffusion between Al and Si does not proceed as far as the nitrogen-containing layer, this has a three-layered lamination structure comprising a second semiconductor layer not substantially containing Al (that is, a semiconductor layer substantially consisting only of Si), an (N, C, F) layer, and an Al—Si diffusion layer, and such as embodiment is also included within the scope of the invention. "Not substantially containing Al" means that the Al concentration is about 0.01 atom % or less when Al is subjected to elemental analysis by the measuring method to be described layer.

The structure of FIG. 2 is obtained, for example, by the method of Example 2 to be described later. In Example 2 for obtaining the three-layered structure described above, the thickness of the second semiconductor layer is increased by making the time longer for depositing the second semiconductor layer above the (N, C, F) layer, and the thickness of the semiconductor layer may be controlled to a range larger than the diffusion distance of Al atoms in relation within the diffusion distance of the Al atoms to the semiconductor layer. The method of obtaining the three layered structure described above is not restricted thereto but, for example, an Al type alloy containing a transition metal such as Ta, Nb, Hf, Ti or V may also be used thereby suppressing the interdiffusion between Al and Si. Other conditions, property, etc, are identical with those described in the first embodiment.

Third Embodiment of the Invention

Figure 3:
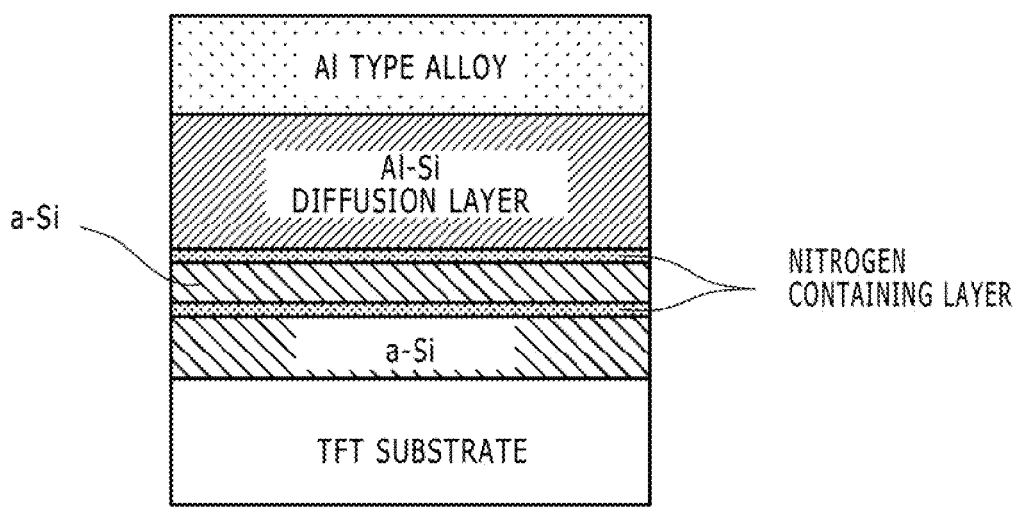
FIG. 3 is a schematic cross sectional explanatory view showing the constitution of a TFT according to a third embodiment of the invention.

The third embodiment of a TFT according to the invention is an example having a first semiconductor layer, an (N, C, F) layer, and a first semiconductor layer between the nitrogen-containing layer constituting the two layered lamination structure in the first embodiment described above and the TFT substrate. Specifically, as shown in FIG. 3, it has a structure of having a first semiconductor layer, an (N, C, F) layer and, a first semiconductor layer above the TFT substrate, having a two layered lamination structure comprising an (N, C, F) layer and an Al—Si diffusion layer directly thereabove, and having a structure where an Al type alloy layer is formed directly thereon. The structure of FIG. 3 is obtained, for example, by the method of Example 3 to be described later. Other conditions, property, etc. are identical with those described in the first embodiment.

Fourth Embodiment of the Invention

Figure 4:
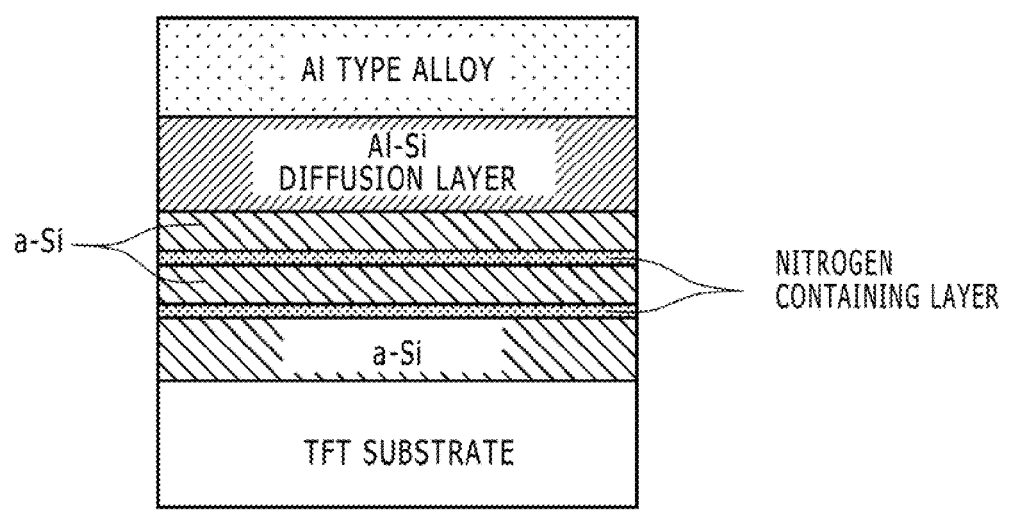
FIG. 4 is a schematic cross sectional explanatory view showing the constitution of a TFT according to a fourth embodiment of the invention.

The fourth embodiment of a TFT according to the invention is an example having a first semiconductor layer, an (N, C, F) layer, and a first semiconductor layer between the nitrogen containing layer constituting the three layered lamination structure and the TFT substrate in the second embodiment described above. Specifically, as shown in FIG. 4, it has a first semiconductor layer, an (N, C, F) layer, and a first semiconductor layer above the TFT substrate, has a three layered lamination structure comprising a second semiconductor layer not substantially containing Al, an (N, C, F) layer, and an Al—Si diffusion layer directly thereabove, and has an Al type alloy layer formed directly thereon. The structure of FIG. 4 can be obtained, for example, by a method of Example 4 to be described later. Other conditions, property, etc. are identical with those described in the first embodiment.

Fifth Embodiment of the Invention

Figure 5:
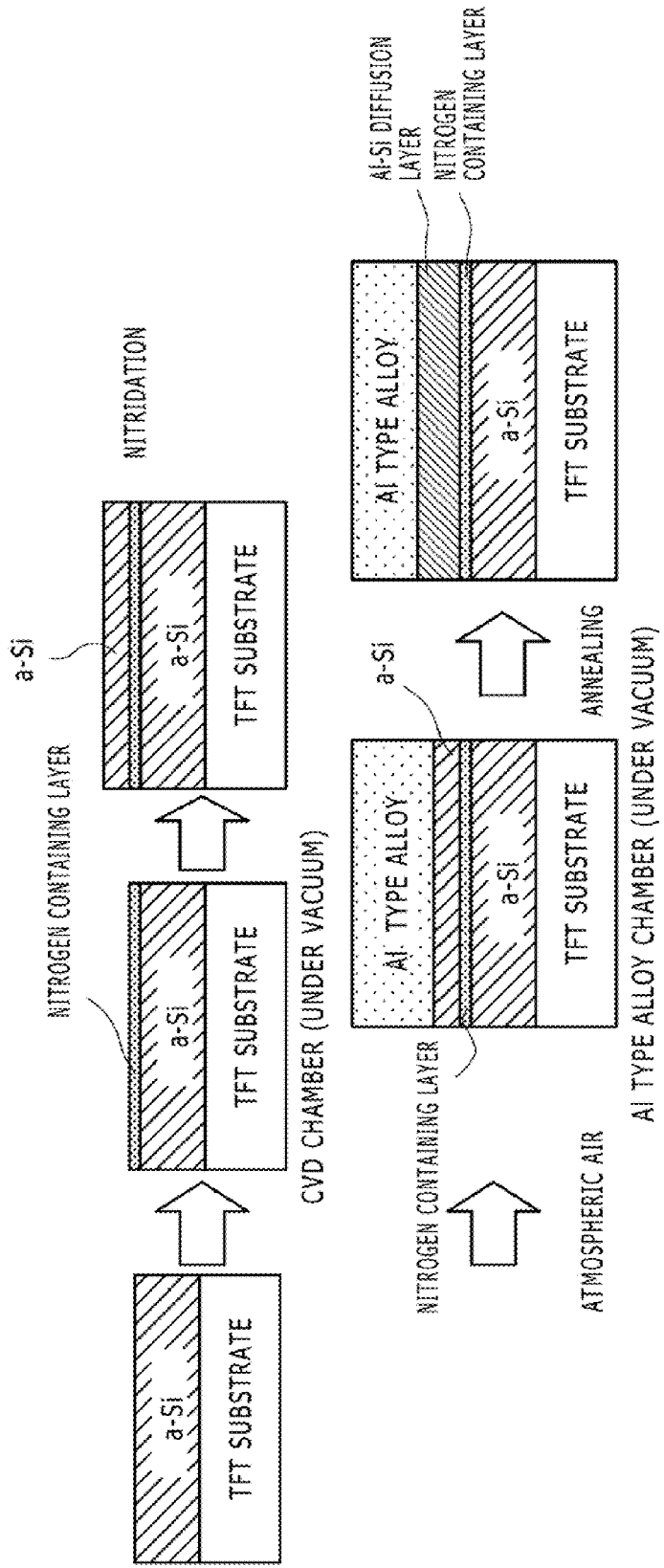
FIG. 5 is a schematic step chart for explaining the steps of an interconnection structure of the invention.

A first embodiment of an MOSFET according to the invention is shown in FIG. 5. FIG. 5 has a two layered lamination structure comprising an (N, C, F) layer and an Al—Si diffusion layer directly above single crystal Si, and has a structure where an Al alloy type layer is formed directly thereon. Such a structure is formed by steps shown in FIG. 8. That is, an (N, C, F) gas is implanted by an ion implantation method or the like into a single crystal Si substrate. In this case, the implanted (N, C, F) gas has a distribution in the direction of depth substantially as a Gaussian distribution with a certain depth (referred to as a range) as a center. A portion of Si is amorphatized by damages from the implanted gas (N, C, F). Then, an Al type alloy is deposited by sputtering and plating and then a heat treatment such as annealing is applied to form a structure of an Al type alloy layer/Al—Si diffusion layer/ (N, C, F) layer/single crystal Si. The structure of FIG. 5 is obtained, for example, by a method of Example 5 to be described later. Other conditions, property, etc. are identical with those described in the first embodiment.

The embodiment described above has the interconnection structure identical with that of the first embodiment of the TFT described above. The embodiment of the MOSFET is not restricted to that described above and, for example, a structure substantially identical with that of the second to fourth embodiments of the TFT described above can be adopted.

EXAMPLES

The invention is to be described more specifically with reference to examples but the invention is not restricted to the following examples but can be practiced by applying modification within a range adaptable to the purports described above and to be described below and all of them are confined within the technical scope of the invention.

In the following Examples 1 to 12, Comparative Examples 1 to 3 and existent examples, annealing was conducted at 300° C. for 30 min to a TFT of FIG. 61 manufactured in accordance with each of step charts in FIG. 6 for simply measuring the TFT property, etc. The annealing conditions were set while assuming a heating treatment in the deposition step of an Si nitride film (protective film) undergoing a maximum thermal hysteresis in the manufacturing steps of the TFT substrate. While the TFT served in this example is not completed while undergoing various deposition steps as in an actual TFT substrate, it is considered that the TFT subjected to the annealing described above substantially reflects the TFT property of the actual the TFT substrate.

Example 1

Example 1 is an example having an interconnection structure of the first embodiment described above (refer to FIG. 1A), and a material comprising Al-0.6 atom % Ni-0.5 atom % Cu-0.3 atom % La was used for the interconnection constituting a source-drain electrode.

Figure 6:
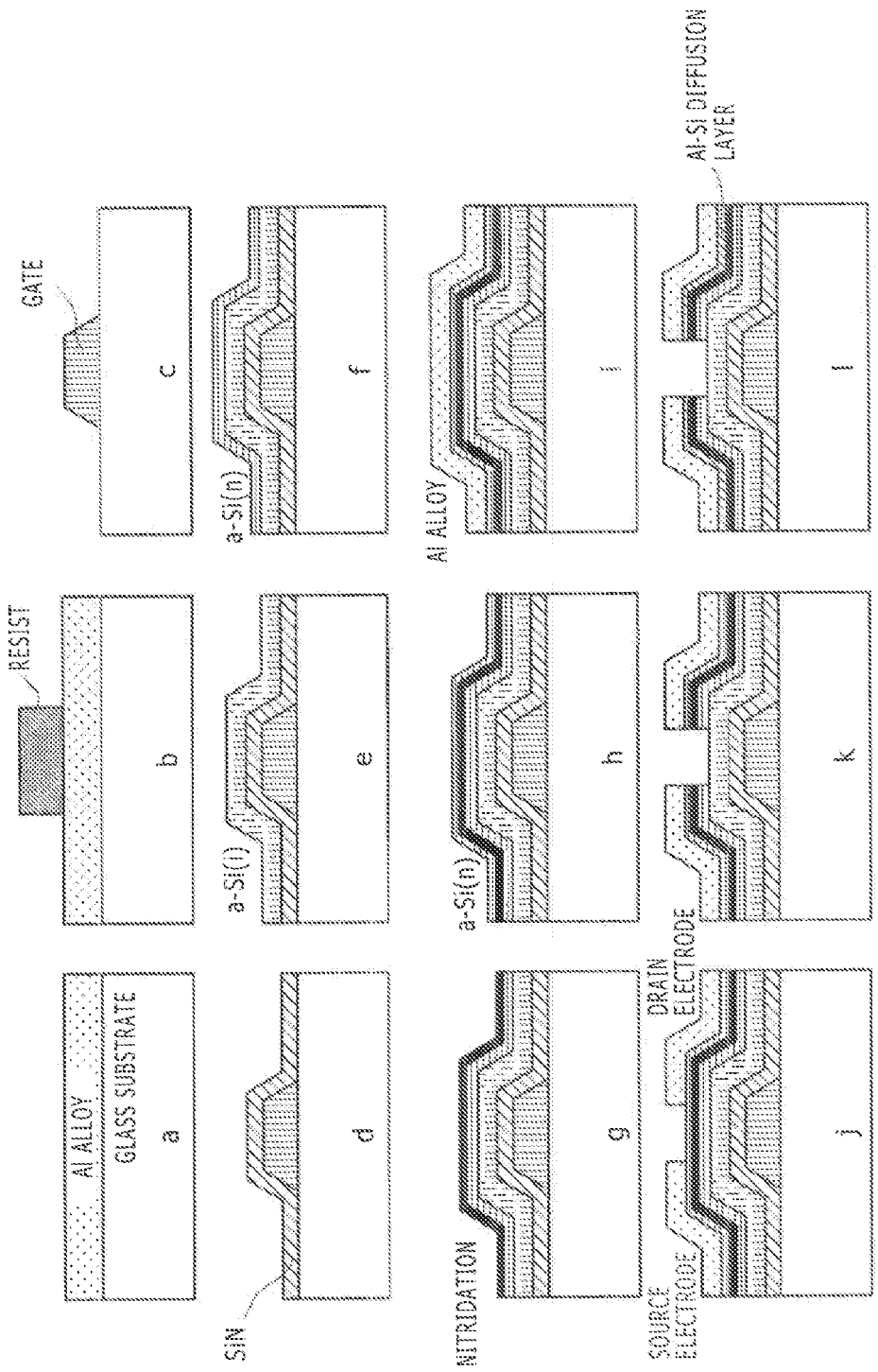
FIG. 6 is a step chart for explaining each of the steps of an interconnection structure of the invention.

A manufacturing method of Example 1 is to be described while referring to each of step charts in FIG. 6.

At first, an Al type alloy thin film (Al-2.0 atom % Nd) of about 200 nm thickness was formed by a sputtering method (FIG. 6a). The deposition temperature for sputtering was defined at a room temperature. After patterning a resist on the Al type alloy thin film by photolithography (FIG. 6b), the Al type alloy thin film was etched using the resist as a mask to form a gate electrode (FIG. 6c).

Then, by a plasma CVD method, a silicon nitride film (SiN) of about 200 nm thickness was formed as a gate insulating film (FIG. 6d). The deposition temperature of the plasma CVD method was defined at about 350° C. Further, a non-doped amorphous silicon film [a-Si(i)] of about 200 nm thickness, and a low resistance amorphous silicon film [a-Si(n)] of about 40 nm thickness doped with an impurity (P) were deposited successively by using a plasma CVD method (FIG. 6e, FIG. 6f). The low resistance amorphous silicon film [a-Si (n)] was formed by conducting plasma CVD using $SiH_4$ and $PH_3$ as the starting material.

Successively, in an identical chamber of an identical plasma CVD apparatus, plasmas were generated by supplying only the nitrogen gas and the surface of the low resistance amorphous silicon film was treated with nitrogen plasmas for 30 sec to form a nitrogen-containing layer (FIG. 6g). It was set such that the high frequency (RF) power density applied to the plasmas was about 0.3 W/cm$^2$, the deposition temperature was at 320° C. and the gas pressure was at 133 Pa. As a result of analyzing the surface by an RBS method and an XPS method, it was confirmed that a nitrogen-containing layer of about 5 nm thickness was formed.

Then, a low resistance amorphous silicon film [a-Si(n)] doped with an impurity (P) was deposited again continuously without taking out of the CVD apparatus. In this case, the thickness of the low resistance amorphous silicon film was defined to about 10 nm (FIG. 6h).

Then, an Al type alloy film (Al-0.6 atom % Ni-0.5 atom % Cu-0.3 atom % La) of about 300 nm thickness was deposited thereon by using a sputtering method (FIG. 6i). The deposition temperature upon sputtering was defined at a room temperature. Then, after patterning the resist by photolithography, the Al type alloy film was etched by using a resist as a mask to form a source electrode and a drain electrode as shown in FIG. 6*j*. Further, all of the low resistance amorphous silicon film [a-Si(n)] were removed by dry etching using the source electrode and the drain electrode as a mask to form a TFT having an Al—Si diffusion layer between the nitrogen-containing layer and the Al type alloy film (FIG. 6*k*, FIG. 6*l*). The thickness of the Al—Si diffusion layer was about 10 nm.

(Evaluation for the TFT Property)

The switching property of the drain current-gate voltage of the TFT was examined by using the TFT described above. Interdiffusion between Si and Al can be evaluated indirectly also by the method. In this case, a leak current flowing during switching OFF period of the TFT (drain current value when a negative voltage is applied for the gate voltage: OFF current) and an ON current flowing during switching ON period of the TFT were measured as described below.

Using the TFT having a gate length(L) of 10 μm, a gate width(W) of 100 μm, and at a W/L ratio of 10, the drain current and the gate voltage were measured. The drain voltage upon measurement was defined to 10 V. The OFF current was defined as a current when a gate voltage (−3 V) was applied, and the ON current was defined as a voltage when the gate voltage was at 20V.

Specifically, as a result of measuring the OFF current and the ON current after annealing the TFT of Example 1 at 300° C. for 30 min, the OFF current was $3.4 \times 10^{-13}$ A and the ON current was $1.7 \times 10^{-6}$ A. For comparison, a TFT was manufactured in the same manner as described above by using a source/drain electrode of an existent example comprising a pure Al film and an Mo barrier metal layer and the TFT property was measured. As a result, the OFF current was $4.0 \times 10^{-13}$ A and the ON current was $1.6 \times 10^{-6}$ A in the existing example. The results are shown in Table 1.

Based on the result described above, it was confirmed for the TFT of Example 1 that an excellent the TFT property similar with that of the TFT of the existent example with interposition of the barrier metal was obtained and interdiffusion between the amorphous silicon and the Al type alloy film did not occur.

(Evaluation for Interdiffusion Between Si and Al)

The boundary between the amorphous silicon and the Al type alloy film after annealing was subjected to cross sectional TEM observation (magnification factor: 300000×) and behaviors of interdiffusion between Si and Al were evaluated. FIG. 9 shows cross sectional TEM images for the boundary. As shown in FIG. 9, Al diffuses as far as the inside of the low resistance amorphous silicon film present therebelow by a heat treatment at 300° C. to form an Al—Si diffusion layer and a distinct barrier layer was observed relative to the Al type alloy film. Therefore, it was confirmed that a lamination structure comprising the nitrogen-containing layer and the Al—Si diffusion layer was formed above the amorphous silicon film according to Example 1. Further, as a result of semi-quantitative analysis by an EDX method, it was found that the Al element was scarcely detected in the low resistance amorphous silicon film and diffusion of Al was blocked at the upper layer of the low resistance amorphous silicon.

(Measurement of Contact Resistance)

Figure 10:
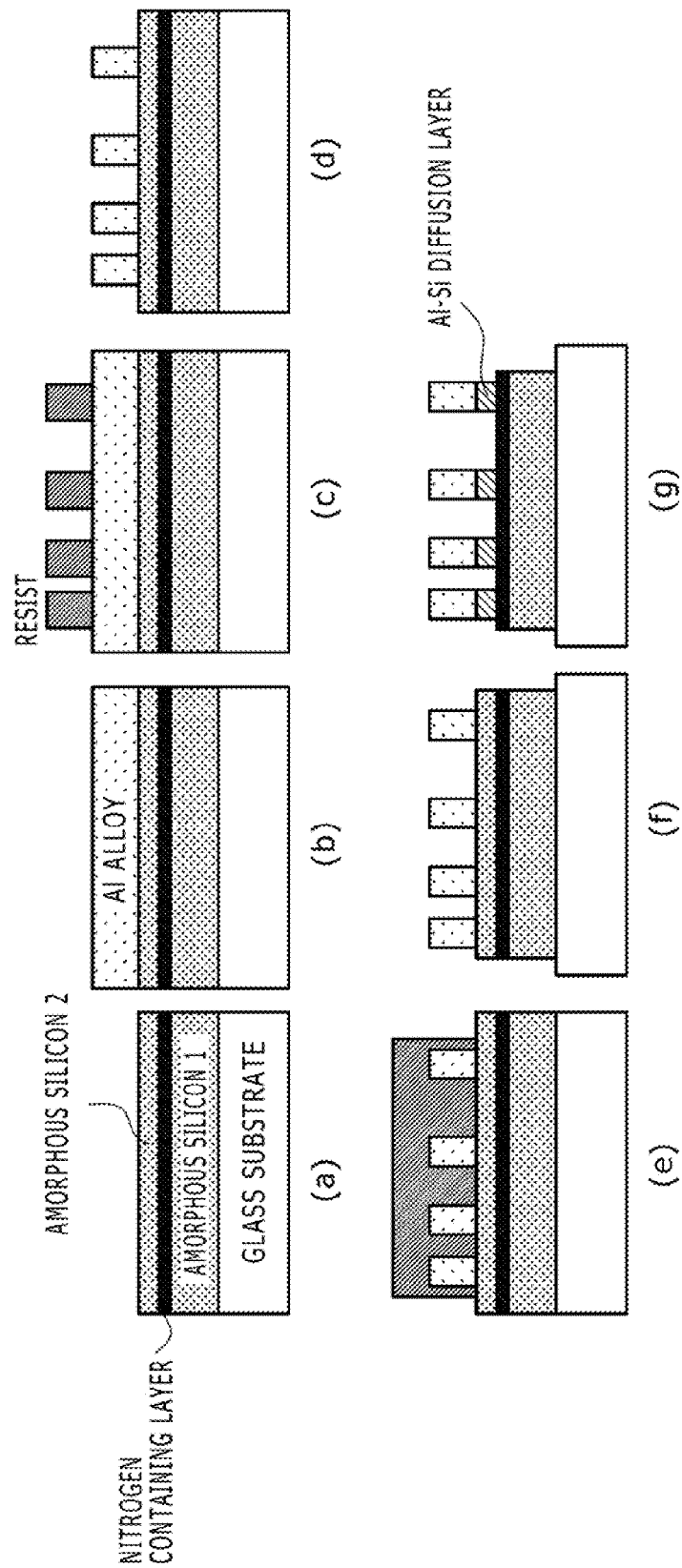
FIG. 10 is a step chart for explaining steps for TLM devices prepared for examining a contact resistance between an Al type alloy film and a semiconductor layer (amorphous silicon).

For examining the contact resistance between the Al type alloy film and the semiconductor layer (amorphous silicon), a TLM device was formed by a TLM method (Transfer Length Method) in accordance with each of step charts shown in FIG. 10.

Figure 11:
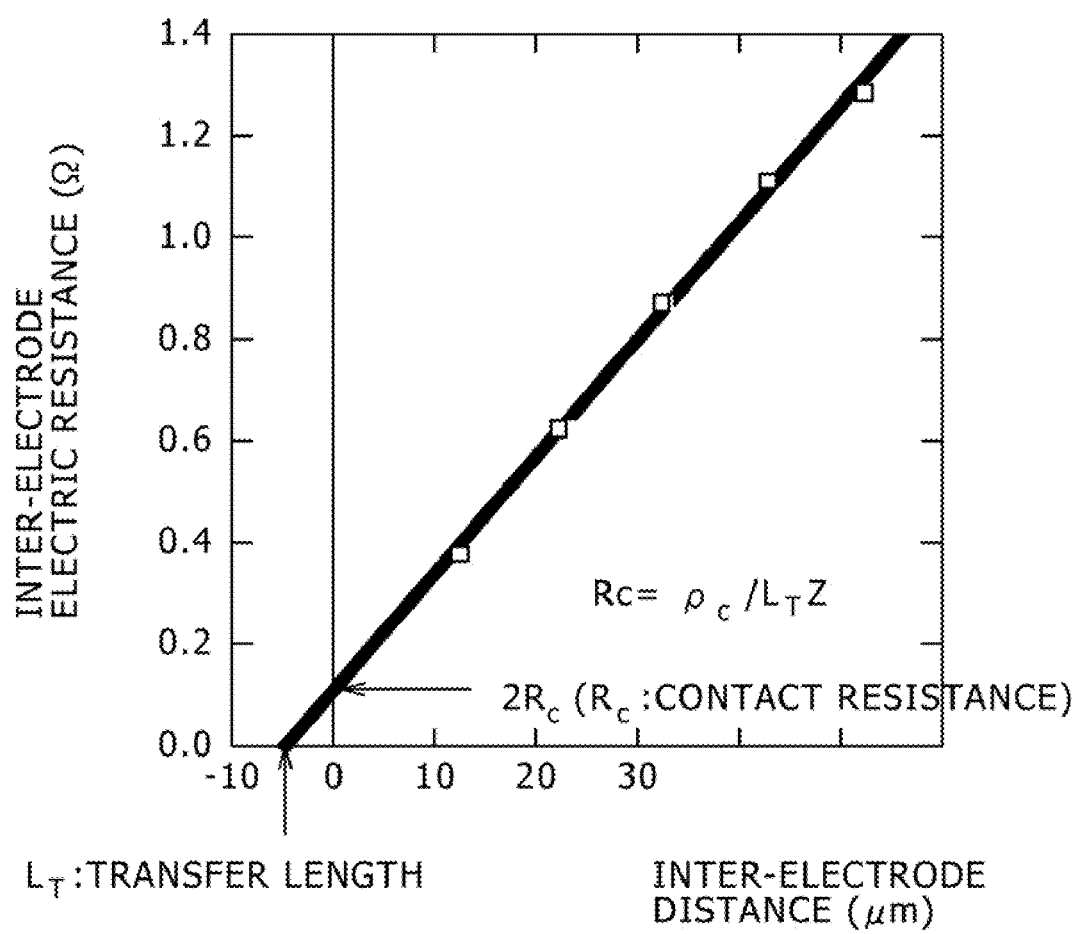
FIG. 11 is a graph showing a relation between an inter-electrode distance and an electric resistance.

At first, a method of manufacturing a TLM device is explained with reference to FIG. 10 and then the principle for the measurement by the TLM method is to be described with reference to FIG. 11 and FIG. 12.

At first, a low resistance amorphous silicon film 1 doped with an impurity (P) of about 200 nm thickness was deposited to about 200 nm thickness by a plasma CVD method. Successively, only the nitrogen gas was supplied in one identical plasma CVD apparatus to generate plasmas and the surface of the low resistance amorphous silicon film 1 was treated by nitrogen plasmas for 30 sec to form a nitrogen-containing layer (FIG. 10*a*). The RF power density applied to the plasmas defined to about 0.3 W/cm².

Then, a low resistance amorphous silicon film 2 again doped with an impurity (P) was deposited continuously without taking out of the CVD apparatus (FIG. 10*a*). The thickness of the low resistance amorphous silicon film 2 was defined to 10 nm. An Al type alloy film (Al-0.6 atom % Ni-0.5 atom % Cu-0.3 atom % La) of about 300 nm thickness was deposited thereon (FIG. 10*b*). After patterning the resist by photolithography (FIG. 10*c*), the Al type alloy was etched by using a resist as a mask to form a plurality of electrodes as shown in FIG. 10*d*. In this case, the distance between each of the electrodes was changed variously. Further, dry etching was conducted again and the resist was patterned by photolithography. In this case, all electrode patterns were covered with a resist as shown in FIG. 10*e*. The low resistance amorphous silicon film at the outer periphery of the electrode pattern was removed by using the resist as a mask (FIG. 10*f*). Finally, a heat treatment was applied at 300° C. for 30 min to form an Al—Si diffusion layer (FIG. 10*g*).

Then, the principle for the measurement of the contact resistance by the TLM method is to be described with reference to FIG. 11 and FIG. 12. FIG. 12(*a*) is a cross sectional view schematically showing the interconnection structure of FIG. 10*g* described above and FIG. 12(*b*) is an upper plan view of FIG. 10*g*. In FIG. 12(*a*), the Al—Si diffusion layer is not shown.

At first, the current-voltage characteristic between each of the plurality of electrodes was measured in the interconnection structure in FIG. 10*g* described above to determine the resistance value between each of the electrodes. A graph of FIG. 11 was obtained by plotting the resistance value between each of the thus obtained electrodes on the ordinate and the inter-electrode distance (transfer length, L) on the abscissa obtained as described above. In the graph of FIG. 11, the value for the y-intercept corresponds to a twice value for the contact resistance Rc (2Rc) and the value for the x-intercept corresponds to an effective contact length ($L_r$: transfer length) respectively. Based on the above, the contact resistivity $\rho_c$ is represented by the following equation.

$\rho_c = Rc * L_r * Z$

Figure 12:
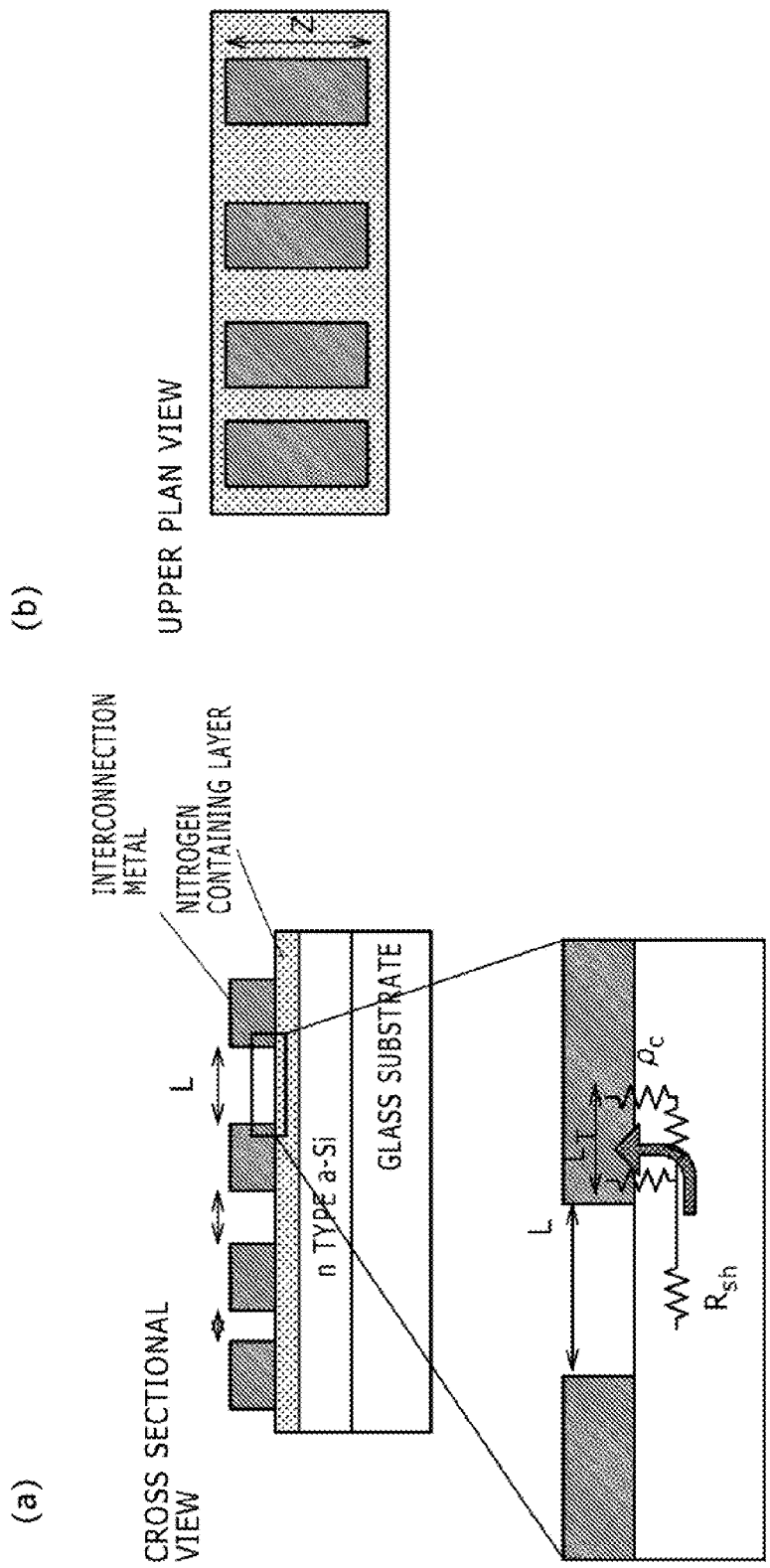
FIG. 12 is a view explaining the principle of measurement for a contact resistance by a TLM device.

In the formula, Z represents an electrode width as shown in FIG. 12(*b*).

The results are shown in Table 1. It can be seen from Table 1 that the TFT of Example 1 has a good contact resistance.

(Measurement for Surface Density of Elements at the Boundary Between Semiconductor Layer and Al Type Alloy Film)

For Example 1 and the existent example, the surface density of nitrogen atoms (N1) and the surface density of oxygen atoms (O1) were measured by using a high resolution power RBS analyzer "HRSB 500" manufactured by Kobe Steel, Ltd. As a result, it was confirmed that the N atom surface density (N1) was below the detection limit and the O atom surface density (O1) was $4.1 \times 10^{15}/cm^2$ in the existent example, whereas the N atom surface density (N1) was $6.3 \times 10^{15}/cm^2$ and the O atom surface density (O1) was below the detection limit, in Example 1 and it had a good TFT property.

Example 2

Example 2 is an example having the interconnection structure of the second embodiment described above (refer to FIG.

2) in which Al-0.6 atom % Ni-0.5 atom % Cu-0.3 atom % La identical with that in Example 1 was used as the interconnection material constituting the source/drain electrode.

A TFT of Example 2 was manufactured in the same manner as in Example 1 except for defining the thickness of the low resistance amorphous silicon film of FIGS. 6h to 200 nm in Example 1 described above. The thickness of the nitrogen-containing layer was about 5 nm in the same manner as in Example 1.

Annealing was applied at 300° C. for 30 min to the thus obtained TFT of Example 2 in the same manner as in Example 1 and cross sectional TEM observation and EDX analysis were carried out for the boundary between the amorphous silicon and the Al type alloy after annealing. As a result, it was judged that the Al elements diffused as far as about 80 to 100 nm in the upper layer of the amorphous silicon film (that is, the thickness of the Al—Si diffusion layer was about 80 to 100 nm), but the Al elements were scarcely diffused to a region deeper than that described above, and an initial state of the amorphous silicon film was maintained at a portion deeper than about 100 nm (not illustrated in the drawing).

Further, as a result of measuring the OFF current and the ON current of Example 2 in the same manner as in Example 1, the OFF current was $3.8 \times 10^{-13}$ A, and the ON current was $1.7 \times 10^{-6}$ A (refer to Table 1). Accordingly, it was found that a good TFT property equivalent to that of the TFT of Comparative Example 1 was obtained in the TFT of Example 2.

Further, for examining the contact resistance of Example 2, the contact resistance was measured in the same manner as in Example 1 except for depositing the low resistance amorphous silicon film to 200 nm in Example 1 described above. The result is as shown in Table 1 and it was found that the TFT of Example 2 had a good contact resistance.

Example 3

Example 3 is an example having the interconnection structure of the third embodiment described above (refer to FIG. 3) in which Al-0.6 atom % Ni-0.5 atom % Cu-0.3 atom % La identical with that in Example 1 was used as the interconnection material constituting the source/drain electrode.

A TFT of Example 3 was manufactured in the same manner as in Example 1 except for adding steps of depositing the low resistance amorphous silicon film of FIG. 6h, then treating the same by nitrogen plasmas again for 30 sec continuously without taking out of the CVD apparatus and depositing a low resistance amorphous silicon doped with the impurity (P) to 10 nm in Example 1 described above. The thickness of the nitrogen containing layer was about 5 nm in the same manner as in Example 1.

Annealing was applied at 300° C. for 30 min to the thus obtained TFT of Example 3, and cross sectional TEM observation and EDX analysis were carried out for the boundary between the amorphous silicon and the Al type alloy after the annealing. As a result, it was found that Al elements were scarcely detected in the amorphous silicon film and Al diffusion was blocked in the upper layer of the amorphous silicon in the same manner as in Example 1 (not illustrated in the drawing). The thickness of the Al—Si diffusion layer was about 10 nm).

Further, as a result of measuring the OFF current and the ON current of Example 3 in the same manner as in Example 1, the OFF current was $3.2 \times 10^{-13}$ A and the ON current was $1.7 \times 10^{-6}$ A. Accordingly, it was found that a good the TFT property equivalent to that of the TFT of Comparative Example 1 was obtained in the TFT of Example 3.

Further, the contact resistance was measured in the same manner as in Example 1 except for depositing the low resistance amorphous silicon film to 10 nm and then applying the nitrogen plasma treatment again to deposit the low resistance amorphous silicon film to 10 nm in Example 1 described above. The result is as shown in Table 1 and it was confirmed that the TFT of Example 3 had a good contact resistance.

Example 4

Example 4 is an example having the interconnection structure of the fourth embodiment described above (refer to FIG. 4) in which Al-0.6 atom % Ni-0.5 atom % Cu-0.3 atom % La identical with that in Example 1 was used as the interconnection material constituting the source/drain electrode.

A TFT of Example 4 was manufactured in the same manner as in Example 1 except for adding the steps of depositing the low resistance amorphous silicon film of FIG. 6h, then treating the same by nitrogen plasmas again for 30 sec continuously without taking out of the CVD apparatus, and depositing a low resistance amorphous silicon doped with the impurity (P) to 200 nm in Example 1 described above. The thickness of the nitrogen containing layer was about 5 nm in the same manner as in Example 1.

Annealing was applied at 300° C. for 30 min to the thus obtained TFT of Example 4 and cross sectional TEM observation and EDX analysis were carried out for the boundary between the amorphous silicon and the Al type alloy after the annealing in the same manner as in Example 1. As a result, it was judged that the Al elements diffused as far as about 80 to 100 nm in the upper layer of the amorphous silicon film (that is, the thickness of the Al—Si diffusion layer was about 80 to 100 nm) but the Al elements were scarcely diffused to a region deeper than about 10 nm, and that the initial state of the amorphous silicon film was maintained at the portion deeper than about 100 nm (not illustrated in the drawing).

Further, as a result of measuring the OFF current and the ON current of Example 4 in the same manner as in Example 1, the OFF current was $3.3 \times 10^{-13}$ A and the ON current was $1.6 \times 10^{-6}$ A (refer to Table 1). Accordingly, it was found that a good TFT property equivalent to that of the TFT of the comparative example was obtained in the TFT of Example 4.

Further, the contact resistance was measured in the same manner as in Example 1 except for conducting the nitrogen plasma treatment again successively to the low resistance amorphous silicon 10 nm and then depositing the low resistance amorphous silicon film to 200 nm and the Al type alloy film to 300 nm in Example 1 described above. The result is shown in Table 1. As shown in Table 1, the TFT of Example 4 had a good contact resistance.

Example 5

Example 5 is an example having the interconnection structure of the fifth embodiment described above (refer to FIG. 7) in which Al-0.6 atom % Ni-0.5 atom % Cu-0.3 atom % La identical with that in Example 1 was used as the interconnection material constituting the source-drain electrode.

In Example 1 described above, after depositing the non-doped amorphous silicon film shown in FIG. 6e, it was again treated by nitrogen plasmas for 30 sec continuously without taking out of the CVD apparatus. Successively, a low resistance amorphous silicon film [a-Si(n)] doped with the impurity (P) was deposited continuously without taking out of the CVD apparatus successively. In this case, the thickness of the low resistance amorphous silicon film was defined to about 10 nm. Subsequently, a TFT of Example 5 was manufactured in the same manner as in Example 1. The thickness of the nitrogen containing layer was about 5 nm in the same manner as in Example 1.

Annealing was applied at 300° C. for 30 min to the thus obtained TFT of Example 5, and cross sectional TEM observation and EDX analysis were carried out for the boundary between the non-doped amorphous silicon film and the Al type alloy after the annealing. As a result, it was found that Al elements were scarcely detected in the non-doped amorphous silicon film and Al diffusion was blocked in the upper layer of the non-doped amorphous silicon in the same manner as in Example 1 (not illustrated in the drawing). The thickness of the Al—Si diffusion layer was about 10 nm.

Further, as a result of measuring the OFF current and the ON current of Example 5 in the same manner as in Example 1, the OFF current was $3.3 \times 10^{-13}$ A, and the ON current was $1.6 \times 10^{-6}$ A (refer to Table 1). Accordingly, it was found that a good TFT property equivalent to that of the TFT of Example 5 was obtained in the TFT of Comparative Example.

Example 6

Example 6 is an example having the interconnection structure of the first embodiment described above (refer to FIG. 1A) and a TFT of Example 6 was manufactured in the same manner as in Example 1 except for using pure Al as the interconnection material constituting source/drain electrode in Example 1 described above.

For the thus obtained TFT of Example 6, the OFF current and the ON current and, further, the contact resistance were measured in the same manner as in Example 1. Results are shown in Table 1.

Example 7

Example 7 is an example having the interconnection structure of the first embodiment described above (refer to FIG. 1A) and a TFT of Example 7 was manufactured in the same manner as in Example 1 except for using Al-0.2 atom % Ni-0.35 atom % La as the interconnection material constituting the source/drain electrode in Example 1 described above.

For the thus obtained TFT of Example 7, the OFF current and the ON current and, further, the contact resistance were measured in the same manner as in Example 1. The results are shown in Table 1.

Example 8

Example 8 is an example having the interconnection structure of the first embodiment described above (refer to FIG. 1A) and the TFT of Example 8 was manufactured in the same manner as in Example 1 except for using Al-2 atom % Ni-0.35 atom % La as the interconnection material constituting source/drain electrode in Example 1 described above.

For the thus obtained the TFT of Example 8, the OFF current and the ON current and, further, the contact resistance were measured in the same manner as in Example 1. Results are shown in Table 1.

Example 9

Example 9 is an example having the interconnection structure of the first embodiment described above (refer to FIG. 1A) and an TFT of Example 9 was manufactured in the same manner as in Example 1 except for using Al-3 atom % Ni-0.6 atom % Nd as the interconnection material constituting source-drain electrode in Example 1 described above.

For the thus obtained the TFT of Example 9, the OFF current and the ON current and, further, the contact resistance were measured in the same manner as in Example 1. Results are shown in Table 1.

It was found from Table 1 that all the TFTs of Examples 6 to 9 could obtain good TFT property and contact resistance identical with those of TFT of the existent example.

While the nitrogen-containing layer was formed using only the nitrogen gas in Examples 1 to 9 described above, the nitrogen-containing layer was formed by using a gas mixture of a nitrogen gas and a semiconductor starting material gas in Examples 10 to 12 to be described later. In the examples, experiment was carried out while varying the flow rate ratio of the gas mixture.

Example 10

Example 10 is an example having the interconnection structure with reference to FIG. 1A, and Al-0.6 atom % Ni-0.5 atom % Cu-0.3 atom % La identical with that in Example 1 was used as the interconnection material constituting the source/drain electrode.

At first, in the same manner as in Example 1, after forming a gate electrode of a thin Al type alloy film (Al-2.0 atom % Nd), a gate insulating film of a silicon nitride film (SiN), a non-doped amorphous silicon film [a-Si(i)], and a low resistance silicon film [a-Si(n), hereinafter sometimes referred to as a first low resistance a-Si(n)] doped with the impurity (P) were deposited sequentially.

Successively, $SiH_4$: 30 sccm, $PH_3$: 0.2 sccm, and $N_2$: 100 sccm (nitrogen gas/semiconductor starting material gas flow rate ratio=3.3) as semiconductor layer forming gases were supplied to generate plasmas for 10 sec in an identical chamber of an identical plasma CVD apparatus, to form a nitrogen-containing layer. A radio frequency wave (RF) power density applied to the plasmas was about 0.06 W/ccm², the deposition temperature was 350° C., and the gas pressure was 67 Pa. Sccm represents standard cubic cm per minute (cm³/min), which is a unit representing the flow rate in a case of converting to 1013 hPa at 0° C. As a result of analyzing the surface by the RBS method and the XPS method, it was confirmed that a nitrogen-containing layer of about 5 nm thickness was formed.

Then, a low resistance amorphous silicon film [a-Si(n)], doped with the impurity (P) [hereinafter sometimes referred to as a second low resistance a-Si(n)] was deposited again to 10 nm in the same manner as in Example 1. Subsequently, a TFT of Example 10 was manufactured in the same manner as in Example 1.

(Evaluation for TFT Property)

As a result of measuring the OFF current and the ON current of Example 10 to the thus obtained TFT of Example 10 in the same manner as in Example 1, the OFF current was $3.2 \times 10^{-13}$ A and the on current was $1.7 \times 10^{-6}$ A (refer to Table 1). Accordingly, it was found that the TFT of Example 10 obtained a good TFT property identical with that of the TFT of the existent example.

(Evaluation for Interdiffusion of Si and Al)

For the TFT of Example 10, cross sectional TEM observation and EDX analysis were carried out for the boundary between the amorphous silicon and the Al type alloy after the annealing treatment at 300° C. for 30 min in the same manner as in Example 1 to evaluate interdiffusion between Si and Al. As a result, it was found that the Al elements were scarcely detected in the amorphous silicon film and the Al diffusion was blocked in the upper layer of the amorphous silicon film. The thickness of the Al film-Si diffusion layer was about 10 nm.

(Measurement of Contact Resistance)

Further, for examining the contact resistance of Example 10, a TLM device was formed by the TLM method and examined in the same manner as in Example 1 described above. Specifically, the contact resistance was measured in the same manner as in Example 1 except for changing the condition for forming the nitrogen-containing layer of the TLM device shown in FIG. 10 (composition gas and gas flow rate ratio) to $SiH_4$: 30 sccm, $PH_3$: 0.2 sccm, $N_2$: 100 sccm as the semiconductor layer forming gas [flow rate ratio of 100 sccm)/semiconductor starting material gas (30 sccm+0.2 sccm)=3.3]. The results are as shown in Table 1. It was confirmed that the TFT of Example 10 had a good contact resistance.

Example 11

Example 11 is an example of changing the flow rate ratio of nitrogen gas/semiconductor semiconductor starting material gas to 0.3 in Example 10 described above.

Specifically, a TFT of Example 11 was manufactured in the same manner as in Example 10 except for changing the gas flow rate as the condition for forming the nitrogen-containing layer to $SiH_4$: 30 sccm, $PH_3$: 0.2 sccm, $N_2$: 10 sccm [flow rate ratio of nitrogen gas (10 sccm)/semiconductor starting material gas (30 sccm+0.2 sccm)=0.3]. The thickness of the nitrogen-containing layer was about 5 nm in the same manner as in Example 10.

To the thus obtained TFT of Example 11, cross sectional TEM observation and EDX analysis were carried out for the boundary between the amorphous silicon and the Al type alloy after the annealing treatment at 300° C. for 30 min in the same manner as in Example 1 to evaluate interdiffusion between Si and Al. As a result, it was found that the Al elements were scarcely detected in the amorphous silicon film and the Al diffusion was blocked in the upper layer of the amorphous silicon film. The thickness of the Al film-Si diffusion layer was about 10 nm.

Further, as a result of measuring the OFF current and the ON current in Example 11 in the same manner as in Example 10, the OFF current was $3.2 \times 10^{-13}$ A and the ON current was $1.8 \times 10^{-6}$ A (refer to Table 1). Accordingly, it was found that a good TFT property equivalent to that of the TFT of Example 11 was obtained in the TFT of the comparative example.

Further, for examining the contact resistance of Example 11, the contact resistance was measured in the same manner as in Example 10 except for changing the gas flow rate as the condition for forming the nitrogen-containing layer to $SiH_4$: 30 sccm, $PH_3$: 0.2 sccm, $N_2$: 10 sccm [flow rate ratio of nitrogen gas (10 sccm)/semiconductor starting material gas (30 sccm+2 sccm=0.3] as the semiconductor layer forming gas. The results are as shown in Table 1. It was confirmed that the TFT of Example 11 had a good contact resistance.

Example 12

Example 12 is an example of changing the flow rate ratio of nitrogen gas/semiconductor starting material gas to 9.9 in Example 10 described above.

Specifically, the TFT of Examples 12 was manufactured in the same manner as in Example 10 except for changing the gas flow rate as the condition for forming the nitrogen-containing layer to $SiH_4$: 30 sccm, $PH_3$: 0.2 sccm, and $N_2$: 300 sccm [gas flow rate ratio of nitrogen gas (300 sccm)/semiconductor starting material gas (30 sccm+0.2 sccm)=9.9] as the semiconductor layer forming gases in Example 10 described above. The thickness of the nitrogen-containing layer was about 5 nm in the same manner as in Example 10.

For the thus obtained the TFT of Example 12, cross sectional TEM observation and EDX analysis were carried out for the boundary between the amorphous silicon and the Al type alloy after the annealing treatment at 300° C. for 30 min in the same manner as in Example 1, to evaluate interdiffusion between Si and Al. As a result, it was found that Al elements were scarcely detected in the amorphous silicon film and diffusion of Al was blocked in the upper layer of the amorphous silicon film in the same manner as in Example 1. The thickness of the Al—Si diffusion layer was about 10 nm.

Further, as a result of measuring the OFF current and the ON current of Example 12 in the same manner as in Example 10, the off current was $3.4 \times 10^{-13}$ A and the on current was $1.5 \times 10^{-6}$ A (refer to Table 1). Accordingly, it was found that a good TFT property equivalent to that of the TFT of the existent example was obtained in the TFT of Example 12.

Further, for examining the contact resistance in Example 12, the contact resistance was measured in the same manner as in Example 10 except for changing the gas flow rate as the condition for forming the nitrogen-containing layer to $SiH_4$: 30 sccm, $PH_3$: 0.2 sccm, and $N_2$: 300 sccm [gas flow rate ratio of nitrogen gas (300 sccm)/semiconductor starting material gas (30 sccm+0.2 sccm)=9.9] as the semiconductor layer forming conditions as in Example 10 described above. The results are as shown in Table 1 and it was confirmed that the TFT of Example 12 had a good contact resistance.

Comparative Example 1

Comparative Example 1 is a comparative example not having a nitrogen-containing layer in the interconnection structure of the first embodiment described above (refer to FIG. 1A) in which the same Al type alloy as that in Example 1 described above was used as the interconnection material for constituting the source/drain electrode. Specifically, a TFT of Comparative Example 1 was manufactured in the same manner as in Example 1 except for not conducting the step of forming the nitrogen-containing layer in Example 1 described above.

For the thus obtained TFT of Comparative Example 1, annealing was applied at a temperature of 200° C. which was lower than that in Example 1 for 30 min, and cross sectional TEM observation and EDX analysis were carried out for the boundary between the amorphous silicon and the Al type alloy after the annealing. As a result, voids were observed in the Al type alloy and the amorphous silicon irrespective of conducting the low temperature treatment at 200° C., and it was found that interdiffusion occurred remarkably (not illustrated in the drawing). Further, also from the semi-quantitative analysis by EDX, Al diffusion in the amorphous silicon and Si diffusion in the Al type alloy were confirmed.

Further, the OFF current and the ON current in Comparative Example 1 were measured in the same manner as in Example 1. As a result, the OFF current was $3.5 \times 10^{-9}$ A, and the ON current was $4.4 \times 10^{-7}$ A (refer to Table 1). From the result described above, it was found that the TFT property was remarkably lowered in Comparative Example 1 not having the nitrogen-containing layer compared with the existent example and it did not function as the TFT.

Further, when the contact resistance in Comparative Example 1 was measured, it was as shown in Table 1 and the contact resistance was lowered.

Comparative Example 2

Comparative Example 2 is an example of changing the flow rate ratio of the nitrogen gas/semiconductor starting material gas to 19.9 in Example 10 described above.

A TFT of Comparative Examples 2 was manufactured in the same manner as in Example 10 except for changing the gas flow rate as the condition for forming the nitrogen-containing layer to $SiH_4$: 30 sccm, $PH_3$: 0.2 sccm, and $N_2$: 600 sccm [gas flow rate ratio of nitrogen gas (600 sccm)/semiconductor starting material gas (30 sccm+0.2 sccm)=19.9] as the semiconductor layer forming gas in Example 10 described above. The thickness of the nitrogen-containing layer was about 5 nm.

For the thus obtained TFT of Comparative Example 2, cross sectional TEM observation and EDX analysis were carried out for the boundary between the amorphous silicon and the Al type alloy after the annealing treatment at 300° C. for 30 min in the same manner as in Example 1, to evaluate interdiffusion between Si and Al. As a result, it was found that Al elements were scarcely detected in the amorphous silicon film and Al diffusion was blocked in the upper layer of the amorphous silicon film in the same manner as in Example 1. The thickness of the Al—Si diffusion layer was about 10 nm.

Further, as a result of measuring the OFF current and the ON current in Comparative Example 2 in the same manner as in Example 10, the OFF current was $3.3 \times 10^{-13}$ A, and the ON current was $4.0 \times 10^{-7}$ A (refer to Table 1). Therefore, it was found that the TFT property of Comparative Example 2 was remarkably deteriorated compared with the existent example and it did not function as the TFT.

Further, for examining the contact resistance in Comparative Example 2, the contact resistance was measured in the same manner as Example 10 except for changing the gas flow rate as the condition for forming the nitrogen-containing layer to $SiH_4$: 30 sccm, $PH_3$: 0.2 sccm, and $N_2$: 600 sccm [gas flow rate ratio of nitrogen gas/semiconductor starting material gas=19.9] as the semiconductor layer forming gas. The results are as shown in Table 1 and the contact resistance was increased.

Comparative Example 3

Comparative Example 3 is an example having the interconnection structure with reference to FIG. 1A, in which Al-0.6 atom % Ni-0.5 atom % Cu-0.3 atom % La identical with that in Example 10 was used as the interconnection material constituting the source/drain electrode.

A TFT of Comparative Examples 3 was manufactured in the same manner as in Example 10 except for changing the gas flow rate as the condition for forming the nitrogen-containing layer to $SiH_4$: 150 sccm, $PH_3$: 1 sccm, and $N_2$: 10 sccm [gas flow rate ratio of nitrogen gas (10 sccm)/semiconductor starting material gas (150 sccm+1 sccm)=0.07] as the semiconductor layer forming gas in Example 10 described above. The thickness of the nitrogen-containing layer was about 5 nm.

For the thus obtained TFT of Comparative Example 3, the cross sectional TEM observation and the EDX analysis were carried out for the boundary between the amorphous silicon and the Al type alloy after the annealing treatment for 300° C. for 30 min in the same manner as in Example 1, to evaluate interdiffusion between Si and Al. As a result, voids were observed in the Al type alloy and in the amorphous silicon, and it was confirmed that interdiffusion occurred remarkably. Further, also from the quantitative analysis by EDX, Al diffusion into the amorphous silicon film and Si diffusion into the all type alloy film were confirmed.

Further, as a result of measuring the OFF current and the ON current in Comparative Example 3 in the same manner as in Example 10, the OFF current was $2.3 \times 10^{-11}$ A, and the ON current was $1.3 \times 10^{-6}$ A (refer to Table 1). Therefore, it was found that the TFT property of Comparative Example 3 was remarkably lowered compared with the existent example and it did not function as the TFT.

TABLE 1

Figure 7:
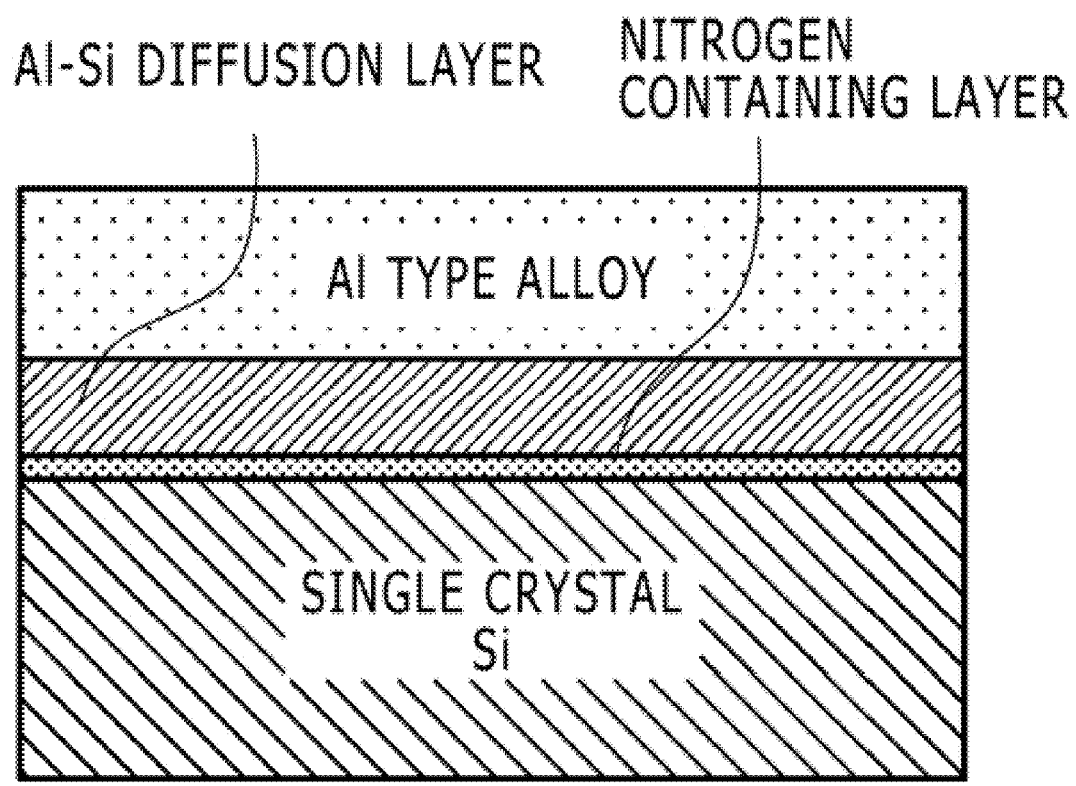
FIG. 7 is a schematic cross sectional explanatory view showing the constitution of an LSI according to a fifth embodiment of the invention.

| No. | Remarks | Source-drain electrode | Nitrogen-containing layer | Gas composition upon forming nitrogen-containing layer | Interconnection structure | On current (A) | Off current (A) | Contact resistance ($\Omega \cdot cm^2$) |
|---|---|---|---|---|---|---|---|---|
| 1 | Example 1 | Al—0.6Ni—0.5Cu—0.3La | Y | (1) | FIG. 1A | 1.7E−06 | 3.4E−13 | 0.10 |
| 2 | Example 2 | Al—0.6Ni—0.5Cu—0.3La | Y | (1) | FIG. 2 | 1.7E−06 | 3.8E−13 | 0.12 |
| 3 | Example 3 | Al—0.6Ni—0.5Cu—0.3La | Y | (1) | FIG. 3 | 1.7E−06 | 3.2E−13 | 0.20 |
| 4 | Example 4 | Al—0.6Ni—0.5Cu—0.3La | Y | (1) | FIG. 4 | 1.6E−06 | 3.3E−13 | 0.22 |
| 5 | Example 5 | Al—0.6Ni—0.5Cu—0.3La | Y | (1) | FIG. 7 | 1.6E−06 | 3.3E−13 | — |
| 6 | Comparative Example 1 | Al—0.6Ni—0.5Cu—0.3La | N | — | FIG. 1A | 4.4E−07 | 3.5E−09 | 2.40 |
| 7 | Example 6 | Pure Al | Y | (1) | FIG. 1A | 1.6E−06 | 3.5E−13 | 0.26 |
| 8 | Example 7 | Al—0.2Ni—0.35La | Y | (1) | FIG. 1A | 1.7E−06 | 2.8E−13 | 0.18 |
| 9 | Example 8 | Al—2Ni—0.35La | Y | (1) | FIG. 1A | 1.7E−06 | 3.8E−13 | 0.16 |
| 10 | Example 9 | Al—3Ni—0.6Nd | Y | (1) | FIG. 1A | 1.6E−06 | 3.4E−13 | 0.23 |
| 11 | Example 10 | Al—0.6Ni—0.5Cu—0.3La | Y | (2) Flow rate ratio = 3.3 | FIG. 1A | 1.7E−06 | 3.2E−13 | 0.12 |
| 12 | Example 11 | Al—0.6Ni—0.5Cu—0.3La | Y | (2) Flow rate ratio = 0.3 | FIG. 1A | 1.8E 06 | 3.2E−13 | 0.20 |
| 13 | Example 12 | Al—0.6Ni—0.5Cu—0.3La | Y | (2) Flow rate ratio = 9.9 | FIG. 1A | 1.5E−06 | 3.4E−13 | 0.22 |
| 14 | Comparative Example 2 | Al—0.6Ni—0.5Cu—0.3La | Y | (2) Flow rate ratio = 19.9 | FIG. 1A | 4.0E−07 | 3.3E−13 | 2.50 |
| 15 | Comparative Example 3 | Al—0.6Ni—0.5Cu—0.3La | Y | (2) Flow rate ratio = 0.07 | FIG. 1A | 1.3E−06 | 2.3E−11 | — |
| 16 | Existent Example | Mo + pure Al | N | — | FIG. 1A | 1.6E−06 | 4.0E−13 | 0.30 |

(1) only nitrogen gas
(2) gas mixture of nitrogen gas/semiconductor starting material gas
Remarks: In the table, "E−x" represents "$10^{-x}$"

Example 13

Example 13 is an example having an LSI interconnection stricture according to the fifth embodiment (refer to FIG. 7), in which pure Al was used as the interconnection material.

A method of manufacturing an MOSFET (Metal-oxide-semiconductor field effect transistor) of Example 13 is to be described with reference to each of step charts in FIG. 13. In this case, a device isolation pattern was formed by an LCOS (Local oxidation of Si) method above a single crystal p-type Si substrate to manufacture an MOSFET in an active region of a device (not locally oxidized region).

At first, a gate insulating film was formed by thermal oxidation over a single crystal p-type Si substrate by thermal oxidation (FIG. 13a). The thickness of the gate insulating film was 5 nm. Successively, P-doped polysilicon was formed to a thickness of 300 nm by thermal oxidation (FIG. 13b). Then, a resist was patterned by lithography (FIG. 13c). The polysilicon was etched by dry etching using the resist as a mask (FIG. 13d). Successively, As was implanted by ion implantation and activating annealing was applied to form a source-drain region (FIG. 13e). Then, an interlayer insulating film was deposited to 600 nm by CVD (FIG. 13f). Then, patterning was applied by lithography (FIG. 13g), and dry etching was applied to form contact holes for connecting a metal interconnection (pure Al) to the source-drain region by applying dry etching (FIG. 13h).

Figure 8:
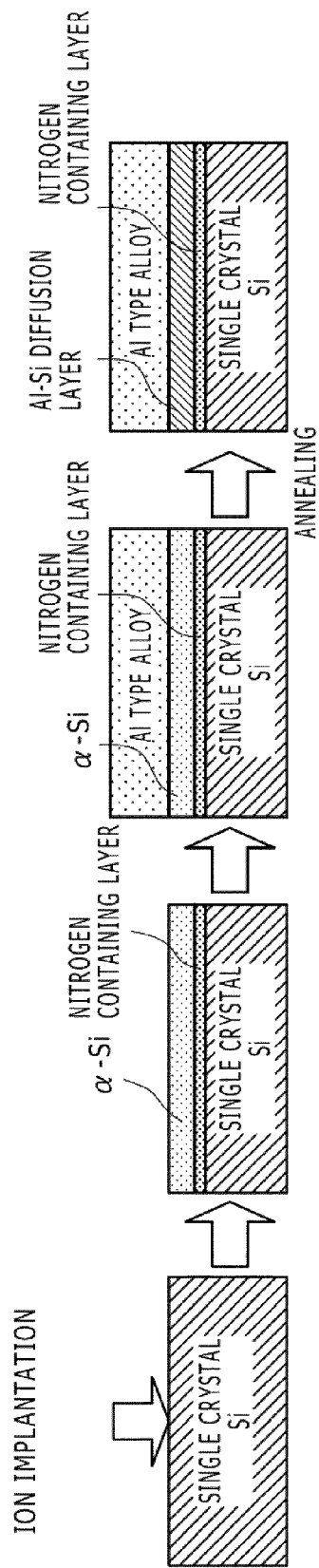
FIG. 8 is a step chart for explaining each of the steps of an interconnection structure according to a fifth embodiment of the invention.

Successively, a structure of Al type alloy layer/Al—Si diffusion layer/nitrogen-containing layer/single crystal Si was formed by way of the step shown in FIG. 8 described previously. That is, nitrogen was implanted into the substrate by an ion implantation method, etc. In this case, the implanted nitrogen had a distribution in the direction of the depth substantially as a Gauss distribution with a certain depth as a center (referred to as a range). In this example, implantation was conducted at an ion energy of 10 keV and the range was controlled to about 10 nm depth. Further, Si was amorphatized with damages of implanted nitrogen for the depth as far as about 15 nm from the surface of the Si substrate (FIG. 13i). The thickness of the nitrogen-containing layer was about 5 nm. Then, pure Al was deposited (FIG. 13j) and fabricated into the interconnection pattern by lithography and etching. Finally, annealing was applied at 400° C. for 30 min to form an Al—Si diffusion layer (FIG. 13k). The thickness of the Al-Si diffusion layer was about 10 nm.

Then, for the MOSFET of Example 13 obtained as described above, switching characteristic of drain current-gate voltage was measured. Specifically, an OFF current (drain current when a negative voltage is applied to the gate voltage) and an ON current upon turn-ON of the MOSFET were used as the index. For an MOSFET having a gate length: L=0.15 µm and a gate width: W=10 µm, the drain current-gate voltage characteristic was measured. The drain voltage upon measurement was 1.5 V. The OFF current was defined as a current value when the gate voltage was −0.5 V, and the ON current was defined as a current value when the gate voltage was 1.5 V.

As a result of measuring the OFF current and the ON current for the MOSFET described above, the off current was $10^{14}$ A or less as the measuring limit and the ON current was 2.3 mA. For the comparison, (1) an MOSFET of a comparative example in which the Si of the source-drain electrode and the pure Al were in direct contact to each other without nitrogen ion implantation and (2) an existent MOSFET in which TiN was interposed as a barrier metal between Si and pure Al were manufactured in the same manner as described above and the characteristics thereof were evaluated. As a result, the OFF current was $2 \times 10^{-9}$ A and the ON current was 1.3 mA in (1) described above, and the OFF current was $10^{-14}$ A or less as the measuring limit and the ON current was 2.2 mA in (2) described above.

From the result described above, the MOSFET of Example 13 could provide excellent TFT property equivalent to that of the extent MOSFET and it was suggested that interdiffusion between Si and Al did not occur.

While the invention has been described specifically with reference to specific embodiments, it will be apparent to persons skilled in the art that various modifications or changes can be made without departing the spirit and the scope of the invention.

The present application is based on Japanese Patent Application filed on Apr. 18, 2008 (No. 2008-109618), and Japanese Patent Application filed on Sep. 30, 2008 (No. 2008-253840), the contents of which are herein incorporated for reference.

Industrial Applicability

According to the invention, it is possible to provide a direct contact technique capable of direct contact of an Al type alloy film of pure Al or Al alloy with a semiconductor layer which is not only excellent in the TFT property and the contact resistance between the Al type alloy film and the semiconductor layer but also has good productivity and, further, extended processing margin. Specifically, it is possible to provide a technique which undergoes less effect of scattering of various kinds of processing conditions (such as scattering of apparatus performance, instability, unexpected contamination, contamination difficult for control, etc.), requires no extremely stringent condition control, and less undergoes restriction for processing conditions.

The invention claimed is:

1. An interconnection structure, comprising a substrate and, from a side of the substrate:
   (I) a semiconductor layer;
   (II) a laminate structure comprising
      (II-a) a first layer comprising at least one element selected from the group consisting of nitrogen, carbon, and fluorine, and
      (II-b) an Al—Si diffusion layer comprising Al and Si; and
   (III) an Al film of pure Al or an Al alloy,
   wherein the at least one element of nitrogen, carbon, and fluorine in the first layer(II-a) is bonded with Si in the semiconductor layer (I).

2. The interconnection structure of claim 1, wherein the laminate structure (II) further comprises between the first layer (II-a) and the Al-Si diffusion layer (II-b):
   (II-b') a second semiconductor layer consisting essentially of Si.

3. The interconnection structure of claim 1, wherein the Al-Si diffusion layer (II-b) is obtained by a process comprising:
   forming, in the following order, the first layer (II-a), a second semiconductor layer (II-b')and the Al film (III); and then
   applying thermal hysteresis, thereby transformining the second semiconductor layer(II-b') into the Al—Si diffusion layer (II-b).

4. The interconnection structure of claim 3, wherein the thermal hysteresis carried out at a temperature of 150° C. or higher.

5. The interconnection structure of claim 1, wherein the semiconductor layer (I) comprises amorphous silicon or polycrystal silicon.

6. A thin film transistor substrate, comprising the interconnection structure of claim 1.

7. A display device, comprising the thin film transistor substrate of claim 6.

8. A method of manufacturing the thin film transistor substrate of claim 6, the method comprising:
(A) forming the first layer (II-a) above the semiconductor layer (I) of the thin film transistor; and then
(B) forming a second semiconductor layer (II-b').

9. The method of claim 8, wherein the first layer (II-a) is formed in a semiconductor forming apparatus.

10. The method of claim 9, wherein the first layer (II-a) and the second semiconductor layer (II-b') are formed continuously in one identical semiconductor layer forming chamber.

11. The method of claim 8, comprising forming the first layer (II-a) by plasma etching with a gas comprising at least one element selected from the group consisting of nitrogen, carbon, and fluorine.

12. The method of claim 8, comprising forming the first layer (II-a) by plasma etching with a gas mixture comprising
i) a gas comprising at least one element selected from the group consisting of nitrogen, carbon, and fluorine, and
ii) a starting material gas employed for forming the second semiconductor layer (II-b').

13. An interconnection structure of claim 1, constituting a display device or a semiconductor device.

14. The interconnection structure of claim 1, wherein the first layer (II-a) comprises nitrogen.

15. The interconnection structure of claim 14, wherein the first layer (II-a) has a thickness within a range of 0.18 to 5 nm.

16. The interconnection structure of claim 14, wherein the first layer (II-a) has a thickness of 3 nm or less.

17. The interconnection structure of claim 1, wherein the Al film (III) is an Al alloy comprising Al and:
i) at least one element selected from the group consisting of Ni, Ag, Zn, and Co; and
ii) at least one selected from the group consisting of Cu, Ge, Si, Mg, In, Sn, and B.

18. The interconnection structure of claim 17, wherein the Al alloy comprises Al, Ni, and Cu.

19. The interconnection structure of claim 18, wherein the Al alloy further comprises:
iii) at least one selected from the group consisting of La, Nd, Gd, and Dy.

20. The interconnection structure of claim 19, wherein the Al alloy comprises La.

* * * * *